US012454768B1

(12) United States Patent
Donofrio

(10) Patent No.: US 12,454,768 B1
(45) Date of Patent: Oct. 28, 2025

(54) HYBRID SEED STRUCTURE FOR CRYSTAL GROWTH SYSTEM

(71) Applicant: Wolfspeed, Inc., Durham, NC (US)

(72) Inventor: Matthew Donofrio, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/941,479

(22) Filed: Nov. 8, 2024

(51) Int. Cl.
*C30B 23/02* (2006.01)
*C30B 29/36* (2006.01)

(52) U.S. Cl.
CPC ............ *C30B 23/025* (2013.01); *C30B 29/36* (2013.01)

(58) Field of Classification Search
CPC ....... C30B 23/025; C30B 23/02; C30B 25/20; C30B 29/36
See application file for complete search history.

(56) References Cited

U.S. PATENT DOCUMENTS 9,484,413 B2 11/2016 Van Brunt et al.
10,294,584 B2 5/2019 Gupta et al.
10,576,585 B1 3/2020 Donofrio et al.
11,219,966 B1 1/2022 Donofrio et al.
11,519,098 B2 12/2022 Khlebnikov et al.
11,654,596 B2 5/2023 Bubel et al.
11,901,181 B2 2/2024 Donofrio et al.
12,043,918 B2 7/2024 Uematsu
12,099,026 B2 9/2024 Yokoyama et al.
2004/0006924 A1 1/2004 Scott et al.
2007/0072324 A1* 3/2007 Krames .................. C30B 29/40 257/E33.028
2009/0011598 A1 1/2009 Nagaya et al.
2017/0047396 A1 2/2017 Van Brunt et al.
2021/0367029 A1 11/2021 Van Brunt et al.
2023/0246073 A1 8/2023 Harrington, III

FOREIGN PATENT DOCUMENTS

CA 3226830 A1 2/2023
CN 110983434 4/2020
CN 111593407 8/2020
CN 112160028 1/2021
CN 112553694 3/2021
CN 112831840 5/2021
(Continued)

OTHER PUBLICATIONS

Disco, "Chemical-Free Stress Relief Dry Polishing Wheel", DP08 Series Product Information, https://www.discousa.com/eg/products/dry_wheel/dp08.html, retrieved on Mar. 7, 2024, 3 pages.
(Continued)

*Primary Examiner* — Robert M Kunemund
(74) *Attorney, Agent, or Firm* — Dority & Manning, P.A.

(57) ABSTRACT

An example seed structure, systems, and methods for conducting crystal growth processes are provided. In one example, the present disclosure provides an example seed structure for a silicon carbide crystal growth system. The seed structure includes a carrier layer. The carrier layer is silicon carbide. The seed structure includes a seed layer bonded to the carrier layer with a bond. The seed layer is crystalline silicon carbide. The seed layer provides a growth surface for growing a crystalline silicon carbide structure in a silicon carbide crystal growth process.

30 Claims, 12 Drawing Sheets

(56) References Cited

FOREIGN PATENT DOCUMENTS

| | | | | |
|---|---|---|---|---|
| CN | 113136622 | | 7/2021 | |
| CN | 113445121 | | 9/2021 | |
| CN | 214782260 | | 11/2021 | |
| JP | 3898278 | | 3/2007 | |
| JP | 4258921 | B2 * | 4/2009 | |
| JP | 2023-024330 | A | 2/2023 | |
| WO | WO-2012144872 | A2 * | 10/2012 | ............ C30B 23/00 |
| WO | WO-2023063278 | A1 * | 4/2023 | |

OTHER PUBLICATIONS

EVG, "ComBond High Vacuum Wafer Bonding Technology", 2024, https://www.evgroup.com/technologies/combond-technology, retrieved on Nov. 7, 2024, 5 pages.
EVG, "EVG ComBond", EV Group Brochure, available on Dec. 15, 2019, 6 pages.
Rena, "ACE Advanced Electrochemical Etching for SiC-Wafers", https://www.rena.com/en/technology/innovations/sic-electrochemical-etching, retrieved on Mar. 7, 2024, 5 pages.
Son et al., "Contact-Area-Changeable CMP Conditioning for Enhancing Pad Lifetime", Applied Sciences MDPI, vol. 11, No. 3521, Apr. 14, 2021, pp. 1-15.
Zhu et al., "Grinding Marks in Back Grinding of Wafer with Outer Rim", Institute of Mechanical Engineers, Journal of Mechanical Engineering Science, Jan. 27, 2020, pp. 1-12.
Colombo et al., "Joining of Reaction-Bonded Silicon Carbide Using a Preceramic Polymer", Journal of Materials Science, vol. 33, 1998, pp. 2405-2412.
Wang et al., "Joining of SiC Ceramics via a Novel Liquid Preceramic Polymer (V-PMS)", Science Direct, Ceramics International, vol. 41, 2015, pp. 7283-7288.
Wu et al., "Joining of SiC Ceramic by Si-C Reaction Bonding Using Organic Resin as Carbon Precursor", MDPI, Materials, vol. 15, No. 4242, 2022, pp. 1-10.
Zhu et al., "Low-Temperature Fabrication of Porous SiC Ceramics by Preceramic Polymer Reaction Bonding", Science Direct, Materials Letters, vol. 59, 2005, pp. 595-597.
Andreoli et al., "Graphite: An Enabler for Single Crystal SiC Growth", Abstract and Poster, ICSCRM 2024: International Conference on Silicon Carbide and Related Materials, Sep. 30, 2024, Raleigh, North Carolina, 3 pages.
Hammer et al., "Crystal Quality Evaluation of 6-inch and 8-inch SiC Growth in Resistive Furnaces: Defect Mapping and Characterization", Abstract, ICSCRM 2024: International Conference on Silicon Carbide and Related Materials, Sep. 30, 2024, Raleigh, North Carolina, 4 pages.
Jeong et al., "Rapid Growth of Bulk SiC Crystals via Physical Vapor Transport Method: Challenges to Improvement in the Crystal Qualities under Rapid Growth", Abstract, ICSCRM 2024: International Conference on Silicon Carbide and Related Materials, Sep. 30, 2024, Raleigh, North Carolina, 4 pages.
Schuck-Buehner et al., "TaC-Based Protective Coating Systems Adapted on Graphite Materials with Different Thermal Expansion for the Use in SiC PVT Crystal Growth", Abstract, ICSCRM 2024. International Conference on Silicon Carbide and Related Materials, Sep. 30, 2024, Raleigh, North Carolina, 4 pages.
Tahara et al., "Study on Effect of Interfacial Pore Between Seed and Graphite Holder for Physical Vapor Transport Growth of 4H-SiC Crystal", Abstract, ICSCRM 2024: International Conference on Silicon Carbide and Related Materials, Sep. 30, 2024, Raleigh, North Carolina, 3 pages.
Taucher et al., "ML-Based Surrogate Model for Temperature Prediction and Efficient Parameter Calibration of PVT Simulations", Abstract, ICSCRM 2024: International Conference on Silicon Carbide and Related Materials, Sep. 30, 2024, Raleigh, North Carolina, 3 pages.
Uematsu et al., "Development of a 200 mm-Diameter 4H-SiC Crystal Using the HTCVD Method Enhanced by Process Informatics", Abstract, ICSCRM 2024: International Conference on Silicon Carbide and Related Materials, Sep. 30, 2024, Raleigh, North Carolina, 3 pages.
Ujihara et al., "8-inch Thick SiC Crystals Grown by Solution Growth Method Combined with Digital Twin", Abstract, ICSCRM 2024: International Conference on Silicon Carbide and Related Materials, Sep. 30, 2024, Raleigh, North Carolina, 5 pages.
Wellmann et al., "Improvement of the Yield During Crystal Growth of SiC by PVT by Proper Selection and Design of Hot Zone Isolation Components", Abstract, ICSCRM 2024: International Conference on Silicon Carbide and Related Materials, Sep. 30, 2024, Raleigh, North Carolina, 4 pages.
Yoshikawa et al., "A Novel Method to Grow 4H-SiC Single Crystals with Low BPD Densities on Multiple Substrates: Grown Crystals' Properties and their Controlling Factors", Abstract, ICSCRM 2024: International Conference on Silicon Carbide and Related Materials, Sep. 30, 2024, Raleigh, North Carolina, 2 pages.
Zhou et al., "Numerical Simulation Study on Different Scales to Suppress Solvent Inclusion Defects in SiC Solution Crystal Growth", Abstract, ICSCRM 2024: International Conference on Silicon Carbide and Related Materials, Sep. 30, 2024, Raleigh, North Carolina, 4 pages.

* cited by examiner

HYBRID SEED STRUCTURE FOR CRYSTAL GROWTH SYSTEM

FIELD

The present disclosure relates generally to silicon carbide workpieces and silicon carbide workpiece fabrication.

BACKGROUND

Semiconductor devices, including power semiconductor devices based on wide bandgap materials, may be formed on a semiconductor wafer as part of a semiconductor fabrication process. Single crystal silicon carbide (SiC) has proven to be a very useful wafer material in the manufacture of such semiconductor devices. Due to its physical strength and excellent resistance to many chemicals, silicon carbide may be used to fabricate very robust substrates adapted for use in the semiconductor industry. Silicon carbide has excellent electrical properties, including radiation hardness, high breakdown field, a relatively wide band gap, high saturated electron drift velocity, high-temperature operation, and absorption and emission of high-energy photons in the blue, violet, and ultraviolet regions of the optical spectrum.

SUMMARY

Aspects and advantages of embodiments of the present disclosure will be set forth in part in the following description, or can be learned from the description, or can be learned through practice of the embodiments.

In an aspect, the present disclosure provides an example seed structure for a silicon carbide crystal growth system. The seed structure includes a carrier layer. The carrier layer is silicon carbide. The seed structure includes a seed layer bonded to the carrier layer with a bond. The seed layer is crystalline silicon carbide. The seed layer provides a growth surface for growing a crystalline silicon carbide structure in a silicon carbide crystal growth process.

In an aspect, the present disclosure provides an example method for conducting crystal growth processes. The method includes providing a seed structure to a crystal growth system. The seed structure includes a carrier layer. The carrier layer is silicon carbide. The seed structure includes a seed layer with a bond to the carrier layer. The seed layer is crystalline silicon carbide. The method includes conducting a crystal growth process to grow a crystalline silicon carbide structure on a growth surface of the seed structure.

In an aspect, the present disclosure provides an example crystal growth system for growing crystalline material. The crystal growth system includes a crucible. The crystal growth system includes a seed holder. The crystal growth system includes a seed structure on the seed holder. The crystal growth system includes a source material within the crucible. The seed structure includes a carrier layer. The carrier layer is silicon carbide. The seed structure includes a seed layer bonded to the carrier layer with a bond. The seed layer is crystalline silicon carbide. The seed layer provides a growth surface for growing a crystalline silicon carbide structure in a silicon carbide crystal growth process.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

Figure 1:
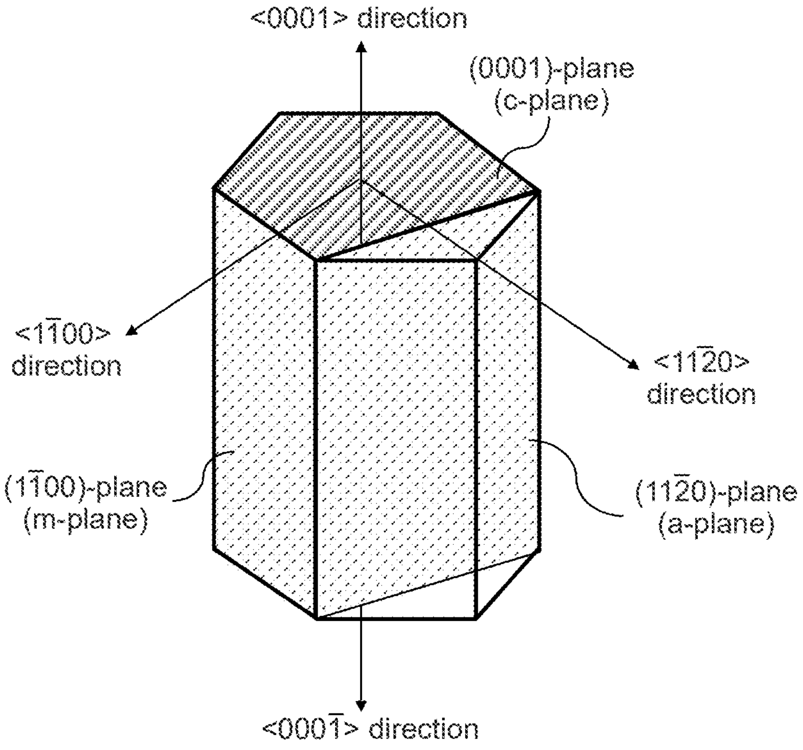
FIG. 1 is a first perspective view crystal plane diagram showing the coordinate system for a hexagonal crystal such as 4H-silicon carbide.

Repeat use of reference characters in the present specification and drawings is intended to represent the same and/or analogous features or elements of the present invention.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations may be made to the embodiments without departing from the scope or spirit of the present disclosure. For instance, features illustrated or described as part of one embodiment may be used with another embodiment to yield a still further embodiment. Thus, it is intended that aspects of the present disclosure cover such modifications and variations.

Power semiconductor devices are often fabricated from wide bandgap semiconductor materials, such as silicon carbide or group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the technology according to example embodiments of the present disclosure may be used with any semiconductor material, such as other wide bandgap semiconductor materials, without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 millimeter, such as greater than about 5 millimeters, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 microns to about 1000 microns, or greater.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Aspects of the present disclosure are directed to systems and methods to produce a seed structure for used in a crystal growth systems, such as silicon carbide crystal growth systems. Silicon carbide crystalline material may be produced using various seeded sublimation crystal growth processes. In some silicon carbide crystal growth processes, a seed material and a source material are arranged in a reaction crucible which is then heated to a sublimation temperature of the source material. By controlled heating of the environment surrounding the reaction crucible, a thermal gradient is developed between the sublimating source material and the marginally cooler seed material. By means of the thermal gradient, source material in a vapor phase is transported onto the seed material where it is deposited to grow a solid bulk crystalline boule. This type of sublimation crystal growth process is commonly referred to as a physical vapor transport (PVT) process.

Control over crystal growth in a PVT crystal growth process is dependent on various interrelated growth parameters. Growth parameters may include, for example, growth temperature, a temperature gradient established by the crystal growth system, growth pressure, gas phase composition, introduction of dopant species, or other parameters, including parameters dependent upon the orientation of the growth system (i.e., distance of a source material to the growth surface, etc.). As such, the interrelated nature of crystal growth parameters makes controlling crystal growth a complex problem. The development and implementation of a seed structure on which sublimated material is deposited to form monocrystalline growth in a PVT crystal growth system may be a basis for determining other crystal growth parameters. For instance, the seed structure quality may determine polytype stability, such as the stability of 4H- or 6H-silicon carbide, grown in a crystal growth process. The quality of the seed structure may provide an avenue to control defect formation or determine subsequent growth parameters such as temperature regimes employable in a PVT crystal growth process. In some instances, deficiencies in a bulk crystal grown in a seeded sublimation growth process can originate with the seed itself and the manner in which the seed is physically handled.

Typically, seed structures for use in a PVT crystal growth system have specific thermomechanical properties that allow desirable processing operations (e.g., separation, removal, handling, or surface processing techniques implemented to create a seed structure from a larger bulk material) and/or control over crystal growth parameters during a PVT crystal growth process (e.g., seed doping concentration). Some high quality seed structures may be as thick as, or thicker than, 1 millimeter to meet thermomechanical requirements to be prepared for use in the crystal growth system and/or to meet crystal growth process requirements. It may be desirable to create multiple high-quality seed structures from a high-quality seed material without altering the thermomechanical properties of the seed structure beyond the requirements of seed structure processing operations and/or crystal growth parameters.

Accordingly, an approach to produce multiple high-quality seed structures from a larger bulk material is needed as new technologies emerge, such as radiation-based (e.g., laser-based) separation techniques of the larger bulk material, that allow the creation of thin seed material layers.

Aspects of the present disclosure are directed toward producing a seed structure with a high-quality seed layer bonded (e.g., directly bonded or bonded through an intervening structure or layer) to a carrier layer, where thermomechanical properties are maintained or enhanced as compared with other seed structures.

Aspects of the present disclosure are directed toward a seed structure for a silicon carbide crystal growth system. The seed structure includes a carrier layer. The carrier layer may be silicon carbide. The seed structure includes a seed layer bonded to the carrier layer. The seed layer may be crystalline silicon carbide. The seed layer of the seed structure may provide a growth surface for growing a crystalline silicon carbide structure in a silicon carbide crystal growth process.

In some embodiments, the seed layer may be bonded to the carrier layer with a direct bond (e.g., with no intervening structures or layers). In some embodiments, the seed layer may be bonded to the carrier layer with one or more intervening structures or layers as an intermediate interface. In some embodiments, the carrier layer may be polycrystalline silicon carbide and the seed layer may be monocrystalline silicon carbide. In some embodiments, the carrier layer may be monocrystalline silicon carbide and the seed layer may be monocrystalline silicon carbide.

The bonding of the seed layer to the carrier layer may be based on interactions or bonding operations performed between the seed layer and the carrier layer. In some embodiments, the bonding of the seed layer to the carrier layer may be based on one or more covalent bonds. In some embodiments, the bonding of the seed layer to the carrier layer may be a plasma-activated bond. In some embodiments, the bonding of the seed layer to the carrier layer may be based on an electrostatic interaction at an interface between the carrier layer and the seed layer. In some embodiments, the electrostatic interaction may be based on a van der Waals interaction. In some embodiments, a plasma pretreatment process, planarization process, etch process (e.g., ion-based etch process) or other pretreatment process may be performed on the surface(s) of the seed layer and/or the carrier layer to prepare for bonding operations (e.g., direct bonding and bonding with an intervening structure or layer) at the interface of the seed layer and the carrier layer.

In some embodiments, the one or more intervening structures include an oxide layer. The oxide layer can be a native oxide layer or an intentionally grown oxide layer, such as an oxide layer grown through a thermal process. The oxide layer can form the bonding interface between the carrier layer and the seed layer. In some embodiments, the oxide layer can be plasma-activated to facilitate covalent bonding. In some embodiments, the bonding process (e.g., plasma-activated bonding process) may remove the oxide layer, such as in the embodiments using a native oxide layer to facilitate the bond. In some embodiments, the bonding process (e.g., plasma-activated bonding process) may not remove the oxide layer.

In some embodiments, the one or more intervening structures may include, for instance, a ceramic forming polymer, a silicon layer, or other intervening layer. In some examples, the intervening layers may provide enhanced thermal conduction (e.g., low thermal impedance) between the carrier layer and the seed layer. An example ceramic forming polymer may be polycarbosilane which may undergo polymer-to-ceramic conversion processes at temperatures between about 300° C. to 1600° C. In some embodiments, the one or more intervening structures have a thickness of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to about 10 μm.

In some embodiments, the carrier layer has a thickness that is greater than a thickness of the seed layer. In some embodiments, the carrier layer has a thickness that is at least five times greater than a thickness of the seed layer. In some embodiments, the carrier layer has a thickness in a range of about 1 μm to about 1000 μm. In some embodiments, the carrier layer has a thickness in a range of about 150 μm to about 500 μm. In some embodiments, the carrier layer has a thickness in a range of about 0.5 mm to about 6 mm or greater, such as about 500 μm to about 2 mm, such as about 2.2 mm to about 4 mm, such as about 4.4 mm to about 6 mm, such as greater than about 6 mm. In some embodiments, the seed layer has a thickness in a range of about 0.2 μm to less than about 500 μm, such as less than about 200 μm, such as less than about 350 μm. In some embodiments, the silicon carbide crystal growth process provides for growth of the crystalline silicon carbide structure on the growth surface of the seed layer at temperatures in a range of about 1500° C. to about 2500° C.

Another aspect of the present disclosure is directed toward a method for conducting crystal growth processes. The method includes providing a seed structure to a crystal growth system. The seed structure includes a carrier layer. The carrier layer may be silicon carbide. The seed structure includes a seed layer bonded to the carrier layer with a bond. The seed layer may be crystalline silicon carbide. The method includes conducting a crystal growth process to grow a crystalline silicon carbide structure on a growth surface of the seed structure.

In some embodiments, the carrier layer may be polycrystalline silicon carbide and the seed layer may be monocrystalline silicon carbide. In some embodiments, the carrier layer may be monocrystalline silicon carbide and the seed layer may be monocrystalline silicon carbide. In some embodiments, the bonding of the seed layer to the carrier layer comprises one or more covalent bonds. In some embodiments, the bonding of the seed layer to the carrier layer may be a plasma-activated bond. In some embodiments, the bond may result from ion-based bonding processes. In some embodiments, the bonding of the seed layer to the carrier layer may be an electrostatic interaction at an interface between the carrier layer and the seed layer. In some embodiments, the electrostatic interaction may be a van der Waals interaction.

In some embodiments, the seed layer may be bonded to the carrier layer with a direct bond (e.g., with no intervening structures or layers). In some embodiments, the seed layer may be bonded to the carrier layer with one or more intervening structures or layers. In some embodiments, the bond provides an interface between one or more of the carrier layer, the seed layer, and one or more intervening structures. In some embodiments, the one or more intervening structures are an oxide layer (e.g., a native oxide layer or thermal oxide layer), a ceramic forming polymer, a silicon layer, or other intervening layer. An example ceramic forming polymer may be polycarbosilane which may undergo polymer-to-ceramic conversion processes at temperatures between about 300° C. to 1600° C. In some embodiments, the one or more intervening structures have a thickness of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to less than about 10 μm.

In some embodiments, the carrier layer may have a thickness that is greater than a thickness of the seed layer. In some embodiments, the carrier layer may have a thickness that is at least five times greater than a thickness of the seed layer. In some embodiments, the carrier layer may have a thickness in a range of about 1 μm to about 1000 μm. In some embodiments, the carrier layer may have a thickness in a range of about 150 μm to about 500 μm. In some embodiments, the carrier layer has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer has a thickness in a range of about 0.2 μm to less than about 500 μm, such as less than about 200 μm, such as less than about 350 μm. In some embodiments, the silicon carbide crystal growth process may be conducted at a temperature in a range of about 1500° C. to about 2500° C.

In some embodiments, the method further includes providing a bulk seed structure of crystalline silicon carbide and separating the seed layer from the bulk seed structure. In some embodiments, the separation further includes inducing a damage region beneath a surface of the bulk seed structure. The method may include bonding the carrier layer (e.g., a silicon face or a carbon face) to the surface (e.g., the silicon face) of the bulk seed structure. The method may include separating the seed layer from the bulk seed structure at least partially along the damage region such that the seed layer remains bonded to the carrier layer after separating the seed layer from the bulk seed structure. In some embodiments, the damage region may be a laser-induced damage region. In some embodiments, the damage region may be an implanted species induced damage region. In some embodiments, the method may further include (after separating the seed layer from the bulk seed structure), performing one or more surface processing operations on the seed layer bonded to the carrier layer. In some embodiments, the surface processing operation includes one or more of grinding, polishing, chemical mechanical polishing, lapping, or electrochemical mechanical polishing.

Another aspect of the present disclosure is directed towards a crystal growth system for growing crystalline material. The crystal growth system includes a crucible. The crystal growth system includes a seed holder. The crystal growth system includes a seed structure on the seed holder. The crystal growth system includes a source material within the crucible. The seed structure may include a carrier layer. The carrier layer may be silicon carbide. The seed structure may include a seed layer bonded to the carrier layer with a bond. The seed layer may be crystalline silicon carbide. The seed layer may provide a growth surface for growing a crystalline silicon carbide structure in a silicon carbide crystal growth process.

In some embodiments, the seed layer may be bonded to the carrier layer with a direct bond (e.g., with no intervening structures or layers). In some embodiments, the seed layer may be bonded to the carrier layer with one or more intervening structures or layers. In some embodiments, the carrier layer may be polycrystalline silicon carbide and the seed layer may be monocrystalline silicon carbide. In some embodiments, the carrier layer may be monocrystalline silicon carbide and the seed layer may be monocrystalline silicon carbide. In some embodiments, the bonding of the seed layer to the carrier layer may be one or more covalent bonds. In some embodiments, the bonding of the seed layer to the carrier layer may be a plasma-activated bond. In some embodiments, the bond may result from ion-based bonding processes. In some embodiments, the bonding of the seed layer to the carrier layer may be an electrostatic interaction at an interface between the carrier layer and the seed layer. In some embodiments, the electrostatic interaction may be a van der Waals interaction.

In some embodiments, the carrier layer may have a thickness that is greater than a thickness of the seed layer. In some embodiments, the carrier layer may have a thickness that is at least five times greater than a thickness of the seed layer. In some embodiments, the carrier layer may have a thickness in a range of about 1 μm to about 1000 μm. In some embodiments, the carrier layer may have a thickness in a range of about 150 μm to about 500 μm. In some embodiments, the carrier layer has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer may have a thickness in a range of about 0.2 μm to less than about 500 μm, such as less than about 200 μm, such as less than about 350 μm. In some embodiments, the silicon carbide crystal growth process may provide for growth of the crystalline silicon carbide structure on the growth surface of the seed layer at temperatures in a range of about 1500° C. to about 2500° C.

In some embodiments, the seed layer may be bonded to the carrier layer with a direct bond (e.g., with no intervening structures or layers). In some embodiments, the seed layer may be bonded to the carrier layer with one or more intervening structures or layers. In some embodiments, the bond provides an interface between the carrier layer, the seed layer, and one or more of intervening structures. In some embodiments, the one or more intervening structures are an oxide layer (e.g., a native oxide layer or thermal oxide layer), a ceramic forming polymer, a silicon layer, or other intervening layer. An example ceramic forming polymer may be polycarbosilane which may undergo polymer-to-ceramic conversion processes at temperatures between about 300° C. to 1600° C. In some embodiments, the one or more intervening structures have a thickness of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to less than about 10 μm.

In some embodiments, the carrier layer may have a thickness that is greater than a thickness of the seed layer. In some embodiments, the carrier layer may have a thickness that is at least five times greater than a thickness of the seed layer. In some embodiments, the carrier layer may have a thickness in a range of about 1 μm to about 1000 μm. In some embodiments, the carrier layer may have a thickness in a range of about 150 μm to about 500 μm. In some embodiments, the carrier layer has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer has a thickness in a range of about 0.2 μm to less than about 500 μm, such as less than about 200 μm, such as less than about 350 μm.

In some embodiments, the silicon carbide crystal growth process may be conducted at a temperature in a range of about 1500° C. to about 2500° C.

Aspects of the present disclosure provide technical effects and benefits. For instance, allowing thinner, high-quality seed layers bonded to a carrier layer to form a seed structure may meet the thermomechanical property requirements for use in a crystal growth system while allowing a larger number of high-quality seed layers to be produced from a high-quality bulk material. This may increase yield and reduce material costs associated with producing high-quality seed materials. Further, the carrier layer may employ lower quality materials that would otherwise not be suitable for crystal growth processes, reducing material waste. Additionally, the thermomechanical properties of the seed structure may be enhanced by employing a thicker carrier substrate, an avenue that is increasingly expensive in terms of material cost with other seed structures that do not employ the multi-layered approach according to aspects of the present disclosure. Further, the increased requirements for a seed material to meet dopant concentration criteria may allow for a larger range of dopant concentrations to be employed in a seed structure with a reduced thickness as compared to a conventional seed structure.

It will be understood that, although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there are no intervening elements present, except in some examples an attach material (e.g., die-attach material, solder, paste, adhesive, sintered material or other material may be present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present, except in some examples an attach material (e.g., die-attach material, solder, paste, adhesive, sintered material or other material may be present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to silicon carbide-based semiconductor structures, such as silicon carbide-based MOSFETs. Those of ordinary skill in the art, using the disclosures provided herein, will understand that the power semiconductor packages according to example embodiments of the present disclosure may be used with any semiconductor material, such as other wide band gap semiconductor materials, without deviating from the scope of the present disclosure. Example wide band gap semiconductor materials include silicon carbide (e.g., 2.996 eV band gap for alpha silicon carbide at room temperature) and the Group III-nitrides (e.g., 3.36 eV band gap for gallium nitride at room temperature).

In the drawings and specification, there have been disclosed typical embodiments and, although specific terms are employed, they are used in a generic and descriptive sense only and not for purposes of limitation of the scope set forth in the following claims.

Figure 2:
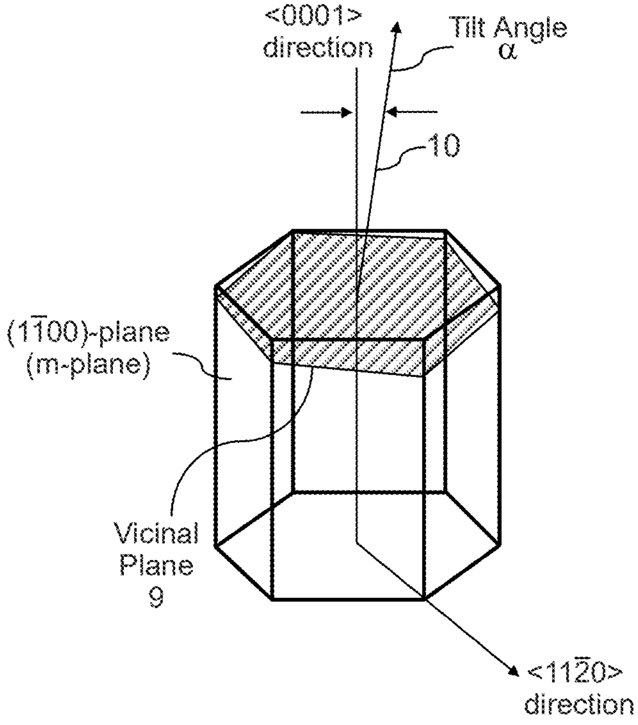
FIG. 2 is a second perspective view crystal plane diagram for a hexagonal crystal, illustrating a vicinal plane that is non-parallel to the c-plane.

FIG. 1 is a first perspective view crystal plane diagram showing the coordinate system for a hexagonal crystal such as 4H-silicon carbide ("SiC"), in which the c-plane (0001) is perpendicular to both the m-plane $(1\bar{1}00)$ and the a-plane $(11\bar{2}0)$. The c-plane is perpendicular to the <0001> direction. The m-plane $(1\bar{1}00)$ is perpendicular to the $\langle 1\bar{1}00 \rangle$ direction. The a-plane $(11\bar{2}0)$ is perpendicular to the $\langle 11\bar{2}0 \rangle$ direction. The $\langle 000\bar{1} \rangle$ direction is opposite the <0001> direction FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the $\langle 11\bar{2}0 \rangle$ direction.

Figure 3A:
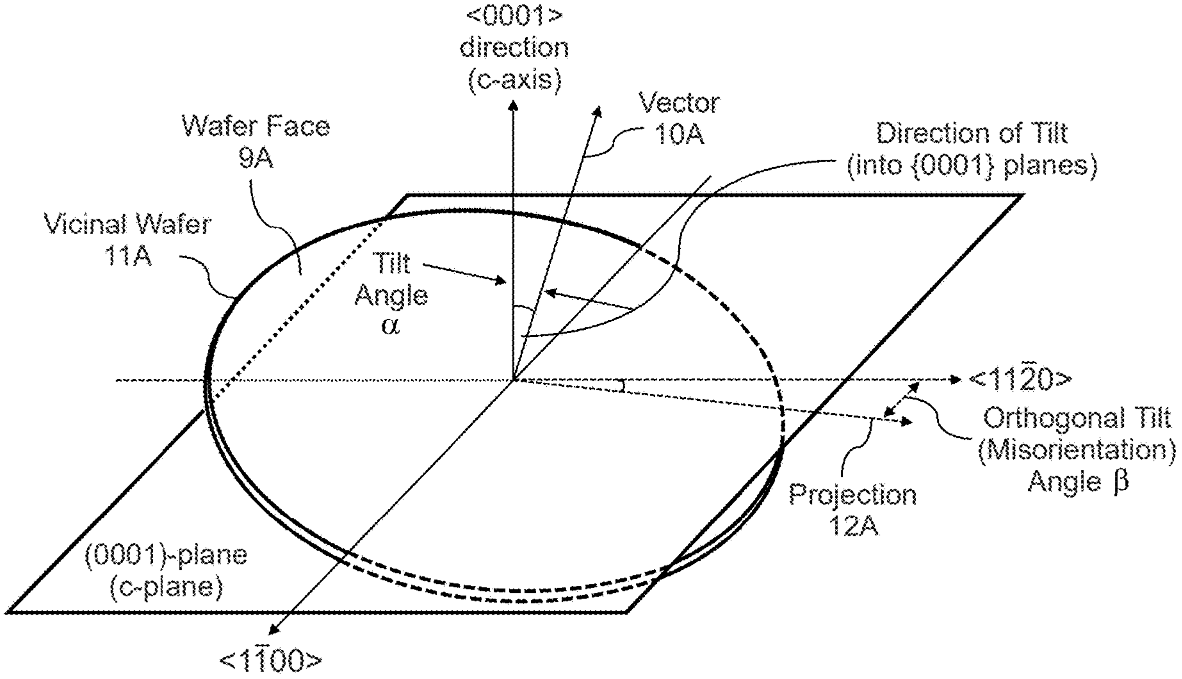
FIG. 3A is a perspective view wafer orientation diagram showing orientation of a vicinal wafer relative to the c-plane.

FIG. 3A is a perspective view of a wafer orientation diagram showing orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the $\langle 11\bar{2}0 \rangle$ direction and the projection of vector 10A onto the c-plane.

Figure 3B:
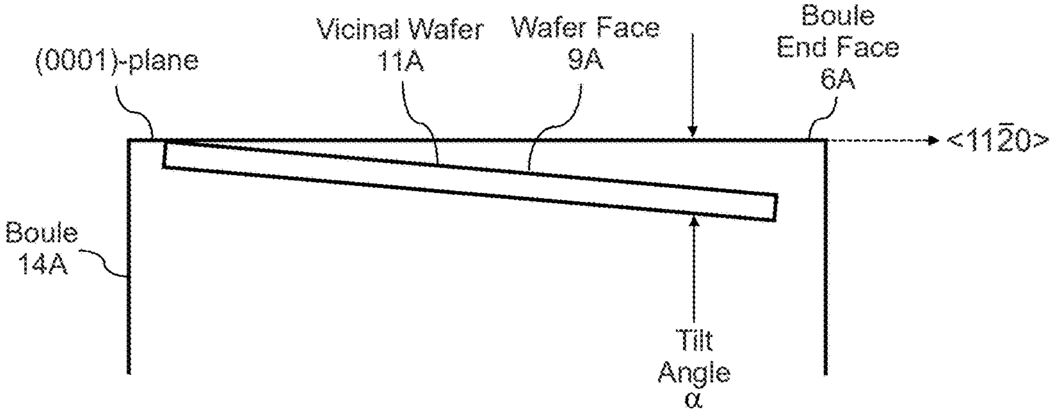
FIG. 3B is a simplified cross-sectional view of the vicinal wafer of FIG. 4A superimposed over a portion of a boule.
Figure 3C:
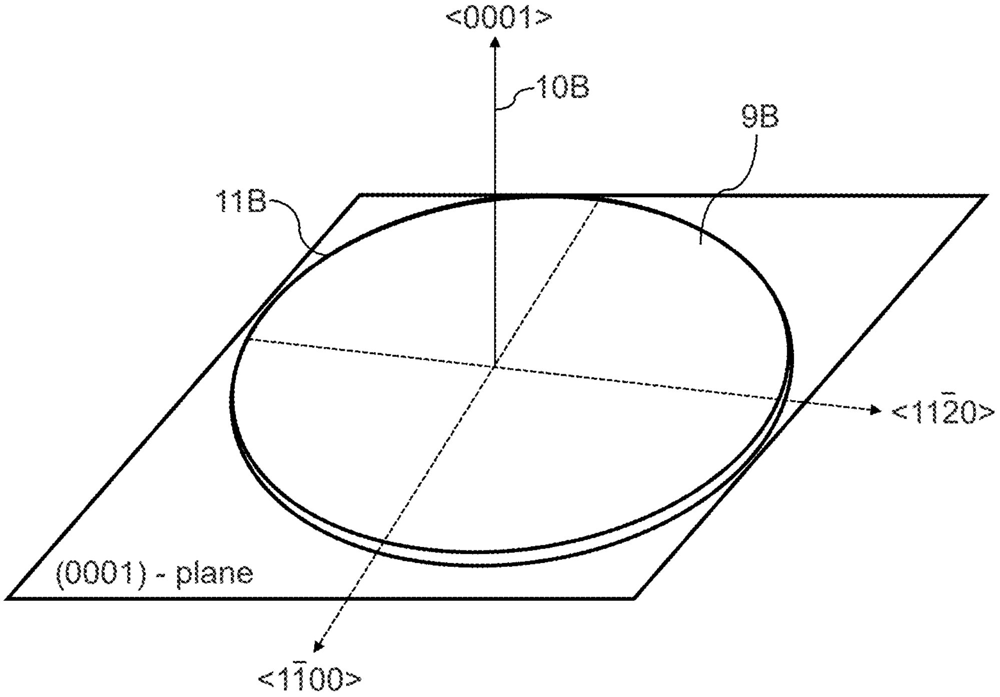
FIG. 3C is a perspective view of a wafer orientation diagram showing orientation of an on-axis wafer relative to the c-plane.
Figure 3D:
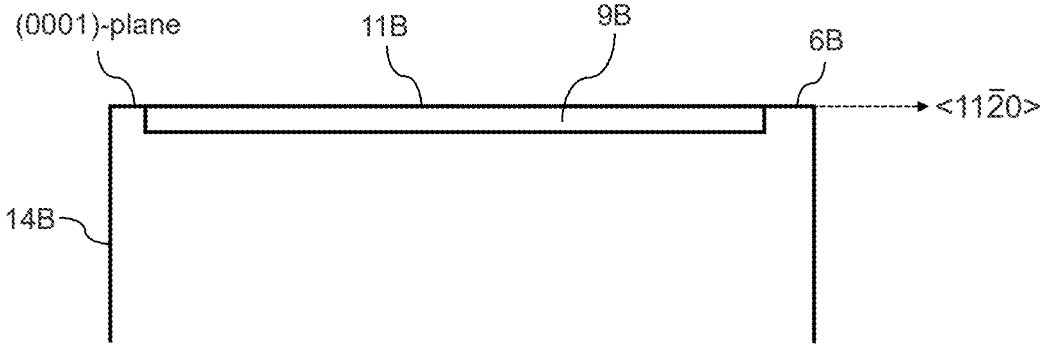
FIG. 3D is simplified cross-sectional view of the wafer of FIG. 3C superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α. FIG. 3C is a perspective view of a wafer orientation diagram showing orientation of an on-axis wafer relative to the c-plane. FIG. 3D is simplified cross-sectional view of the wafer of FIG. 3C superimposed over a portion of a boule.

Figure 4:
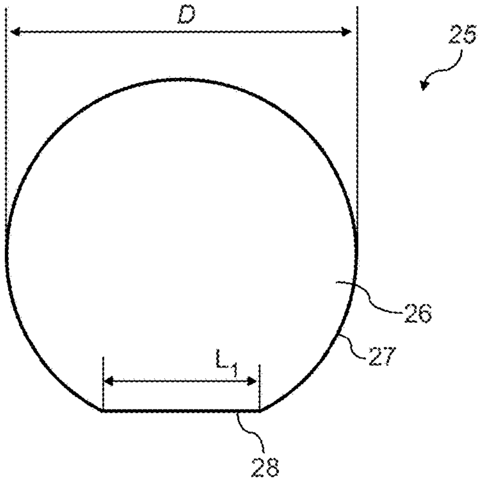
FIG. 4 is a top plan view of an example silicon carbide wafer.
Figure 5A:
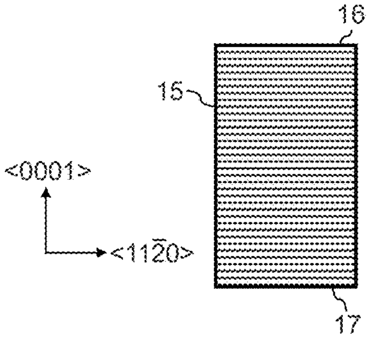
FIG. 5A is a side elevation schematic view of an on-axis boule of crystalline material.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length $L_1$) that is perpendicular, for instance, to the $(11\bar{2}0)$ plane. In some instances, the wafer 25 may include a notch instead of a flat. FIG. 5A is a side elevation schematic view of an on-axis boule of crystalline material.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having hexagonal crystal structure, such as 4H-SiC, 6H-SiC, or Group III nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5B:
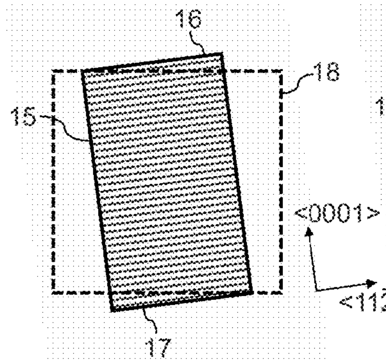
FIG. 5B is a side elevation schematic view of the boule of FIG. 5A being rotated by 4 degrees, with a superimposed pattern for cutting end portions of the boule.
Figure 5C:
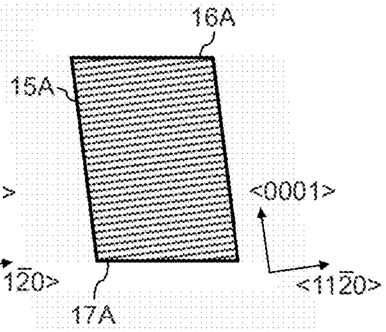
FIG. 5C is a side elevation schematic view of a boule following removal of end portions to provide end faces that are non-perpendicular to the c-direction.
Figure 5D:
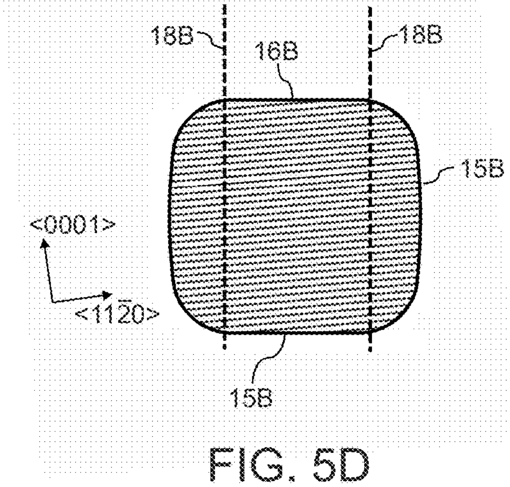
FIG. 5D is a side elevation schematic view of an off-axis grown boule of crystalline material.
Figure 5E:
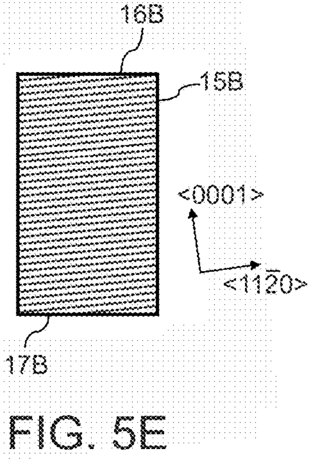
FIG. 5E is a side elevation schematic view of an off-axis grown boule having end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H-SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following removal of end portions to provide new end faces 16A, 17A that are non-perpendicular to the c-direction. Aspects of the present disclosure are applicable both on-axis boules 15 and/or off-axis boules 15A or other on-axis crystalline materials and/or off-axis crystalline materials.

Figure 6:
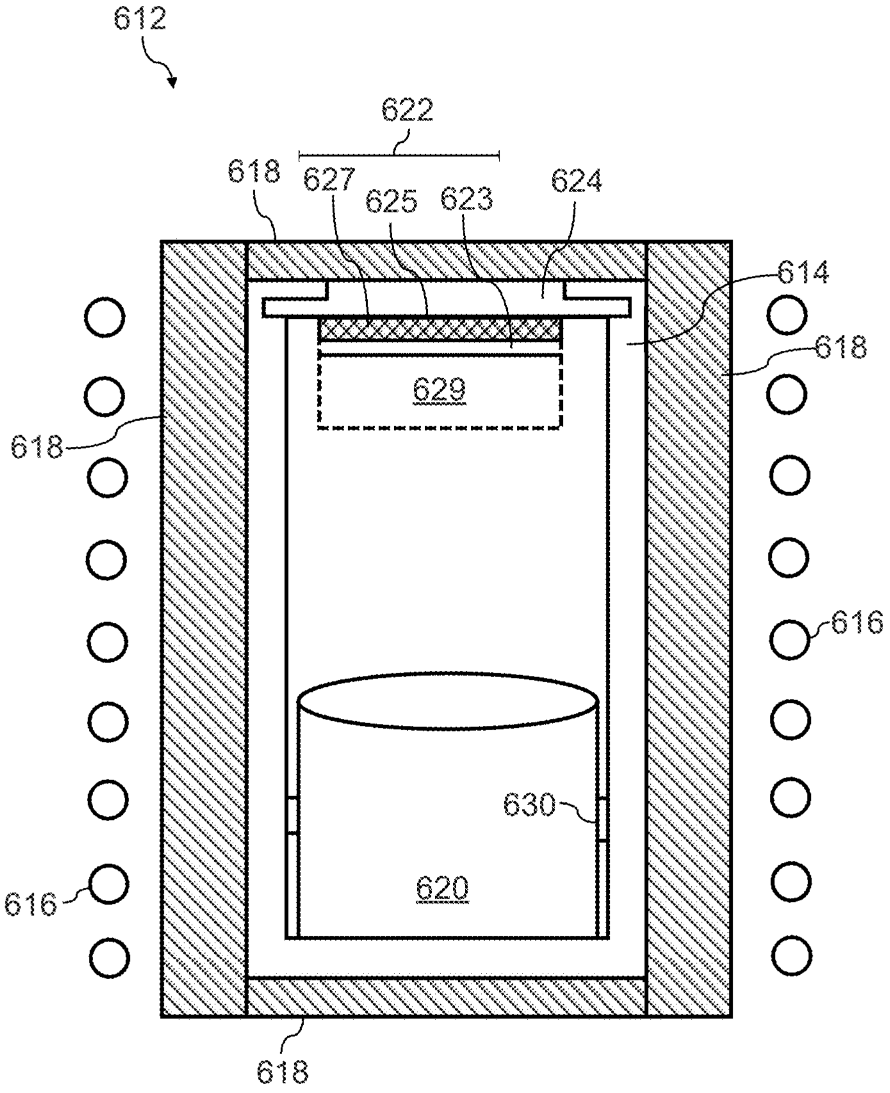
FIG. 6 depicts an example system according to aspects of the present disclosure.

FIG. 6 is a cross-sectional schematic diagram of a crystal growth system 612 adapted for use in a crystal growth process of the type contemplated by certain embodiments of the present disclosure. The crystal growth system 612 includes a reaction crucible 614 (also referred to as a susceptor or growth cell) and a plurality of induction coils 616 adapted to heat the reaction crucible 614 when electrical current is applied. Alternatively, a resistive heating approach may be applied to the heating of the reaction crucible 614. Using any competent heating mechanism and approach, the temperature within the crystal growth system 612 may be controllable. The reaction crucible 614 may be, at least in part, a graphite structure.

The crystal growth system 612 may also include one or more gas inlet and gas outlet ports and associated equipment allowing the controlled introduction and evacuation of gas from an environment surrounding the reaction crucible 614. The introduction and evacuation of various gases to or from the environment surrounding the reaction crucible 614 may be accomplished using a variety of inlets/outlets, pipes, valves, pumps, gas sources, and controllers. It will be further understood by those skilled in the art, using the disclosures provided herein, that the crystal growth system 612 may further incorporate in certain embodiments a water-cooled quartz vessel.

The reaction crucible 614 may be surrounded by an insulation material 618. The composition, size, and placement of the insulation material 618 will vary with an individual crystal growth system, such as the crystal growth system 612 of FIG. 6, to define and/or maintain desired thermal gradients (both axially and radially) in relation to the reaction crucible 614. For purposes of clarity, the term, "thermal gradient," will be used herein to describe one or more thermal gradient(s) associated with the reaction crucible 614. Those skilled in the art, using the disclosures provided herein, recognize that "the thermal gradient" established in embodiments of the disclosure will contain (or may be further characterized as having) axial and radial gradients, or may be characterized by a plurality of isotherms.

Prior to establishment of the thermal gradient, the reaction crucible 614 is loaded with a source material 620. As such, the reaction crucible 614 includes one or more portions, at least one of which is capable of providing the source material 620. The source material 620 may be held in a lower portion of the reaction crucible 614, as is common for one type of crystal growth system, such as the crystal growth system 612 of FIG. 6.

A seed structure 622 may be placed above or in an upper portion of the reaction crucible 614. In the embodiment illustrated in FIG. 6, the seed structure 622 may include a seed layer 623 that is directly bonded (e.g., with no intervening structures or layers) through a bond 625 to a carrier layer 627. The bond 625 may be based on interactions or bonding operations between the seed layer 623 and the carrier layer 627, with no intervening structures or layers at the interface after the bonding process is completed. In some embodiments, the seed structure 622 may include one or more intervening structures between the seed layer 623 and the carrier layer 627, as discussed in detail below.

In some embodiments, the carrier layer 627 may be silicon carbide. The seed layer 623 may be crystalline silicon carbide. In some embodiments, the carrier layer 627 may be polycrystalline silicon carbide and the seed layer 623 may be monocrystalline silicon carbide. In some embodiments, the carrier layer 627 may be monocrystalline silicon carbide and the seed layer 623 may be monocrystalline silicon carbide. In some embodiments, the bond 625 may be based on one or more covalent bonds. In some embodiments, the bond 625 may be based on a plasma-activated bond, such as a plasma-based activation of a native oxide layer that is removed in a bonding process to create the bond 625 directly between the seed layer 623 and the carrier layer 627. In some embodiments, the bond 625 may result from ion-based processes (e.g., ion beam etching) performed on a native oxide layer. In some embodiments, the bond 625 may be based on an electrostatic interaction at an interface between the carrier layer 627 and the seed layer 623. In some embodiments, the electrostatic interaction may be based on a van der Waals interaction.

In some embodiments, the carrier layer 627 may have a thickness that is greater than a thickness of the seed layer 623. In some embodiments, the carrier layer 627 may have a thickness that is at least five times greater than a thickness of the seed layer 623. In some embodiments, the carrier layer 627 may have a thickness in a range of about 1 μm to about 1000 μm. In some embodiments, the carrier layer 627 may have a thickness in a range of about 150 μm to about 500 μm. In some embodiments, the carrier layer 627 has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer 623 may have a thickness in a range of about 0.2 μm to less than about 500 μm, such as less than about 200 μm, such as less than about 350 μm. The seed structure 622, comprising the seed layer 623, the carrier layer 627, and other components are discussed in more detail below.

The seed layer 623 may provide a growth surface for growing a crystalline silicon carbide structure in a silicon carbide crystal growth process. A silicon carbide structure 629, represented by the dashed lines, will be grown from the seed structure 622 during a crystal growth process. In some embodiments, the silicon carbide crystal growth process may provide for growth of the crystalline silicon carbide structure on the growth surface of the seed layer at temperatures in a range of about 1500° C. to about 2500° C. In some embodiments, the growth surface may be a carbon face of the seed layer 623. In some embodiments, the bond 625 may be made between a silicon face of the seed layer 623 and either the silicon or the carbon face of the carrier layer 627.

In the embodiment illustrated in FIG. 6, a seed holder 624 is used to hold the seed structure 622. The seed holder 624 is securely attached to the reaction crucible 614 in an appropriate fashion. For example, in the orientation illustrated in FIG. 6, the seed holder 624 is attached to an uppermost portion of the reaction crucible 614 to hold the seed structure 622 in a desired position. In some embodiments, the seed holder 624 is fabricated from carbon (e.g., graphite). The attachment of the seed structure 622 (e.g., the carrier layer 627) to the seed holder 624 within the crystal growth system 612 may be made, for instance, by a uniform thermal contact. Various techniques may be used to implement a uniform thermal contact. For example, the seed structure 622 (e.g., the carrier layer 627) may be placed in direct physical contact with the seed holder 624, or an adhesive may be used to fix the seed structure 622 (e.g., the carrier layer 627) to the seed holder 624, so as to provide uniform conductive and/or radiative heat transfer over substantially the entire area between the seed structure 622 (e.g., the carrier layer 627) and the seed holder 624.

Figure 7A:
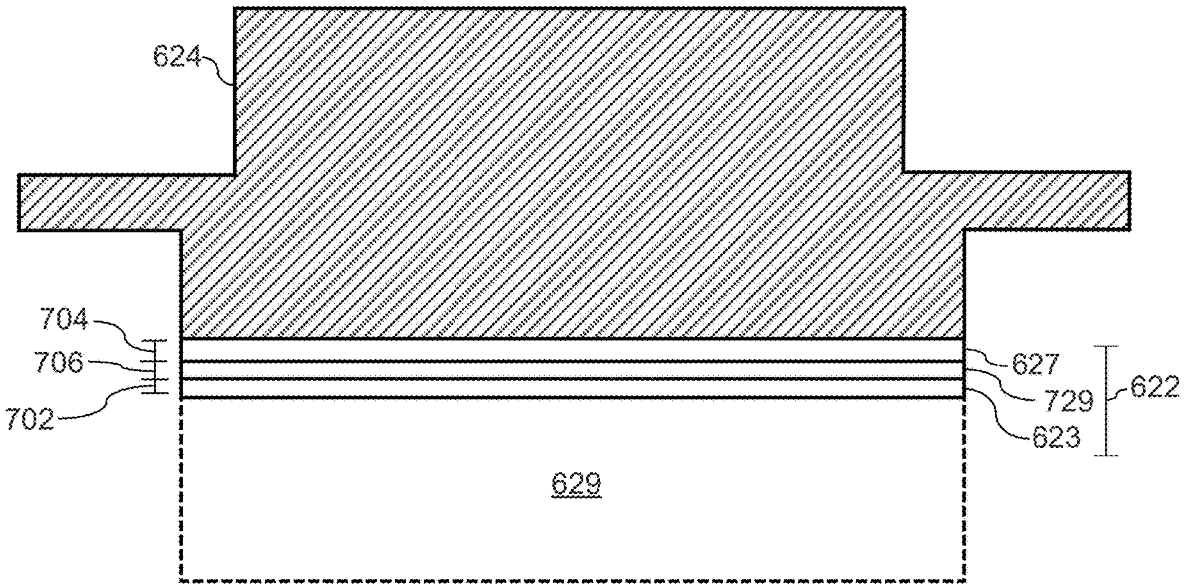
FIGS. 7A and 7B depict a cross-sectional view of a seed structure and seed holder according to aspects of the present disclosure.
Figure 7B:
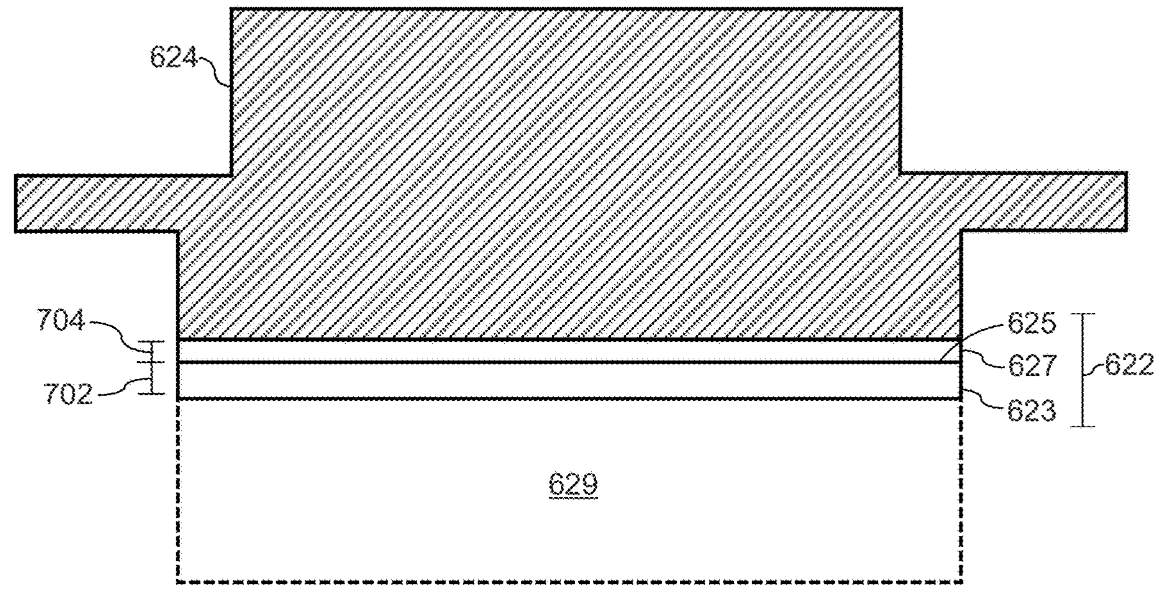

FIGS. 7A and 7B depict a cross-sectional view of the seed structure 622 attached to the seed holder 624. In FIG. 7A, the seed structure 622 includes the seed layer 623, one or more intervening structures 729, and the carrier layer 627. The carrier layer 627 is bonded to the seed holder 624 used to position the seed structure 622 within the reaction crucible of a crystal growth system, such as the crystal growth system 612 of FIG. 6, or any of the crystal growth systems of FIGS. 10 and 11.

In FIG. 7B, the seed structure 622 includes the seed layer 623 directly bonded (e.g., with the bond 625) to the carrier layer 627. The carrier layer 627 is bonded to the seed holder 624 used to position the seed structure 622 within the reaction crucible of a crystal growth system, such as the crystal growth system 612 of FIG. 6, or any of the crystal growth systems of FIGS. 10 and 11.

In some embodiments of FIGS. 7A and 7B, the carrier layer 627 may be silicon carbide. The seed layer 623 may be crystalline silicon carbide. In some embodiments, the carrier layer 627 may be polycrystalline silicon carbide and the seed layer 623 may be monocrystalline silicon carbide. That is, the carrier layer 627 may exhibit some amount of planar defects that separate regions of different crystalline orientation (e.g., grains) of the polytype of the crystal structure utilized. In some embodiments, the carrier layer 627 may be monocrystalline silicon carbide and the seed layer 623 may be monocrystalline silicon carbide. That is, the carrier layer 627 and the seed layer 623 may exhibit highly ordered crystalline structure (e.g., a singular grain) of the polytype of the crystal structure utilized. In some embodiments, the carrier layer 627 that is monocrystalline silicon carbide may differ from the monocrystalline silicon carbide seed layer 623 in axis orientation, purity, dopant concentration, or other properties.

The seed layer 623 and the carrier layer 627 may exhibit different thermomechanical properties or may otherwise influence crystal growth parameters through thickness-controlled parameters (e.g., diffusion, thermal impedance, etc.). For example, the seed structure 622 may need a prescribed thickness based on geometric and stiffness constraints of the seed layer 623 and the carrier layer 627 in order to undergo surface processing operations prior to implementation in a crystal growth system. As such, it may be desired that the seed layer 623 have a thickness 702 and the carrier layer 627 have a thickness 704. The one or more intervening structures 729 have a thickness 706 which may impact thermomechanical properties of the seed structure 622 represented in the embodiment illustrated in FIG. 7A. The thicknesses 702, 704 of the seed layer 623 and the carrier layer 627 may be tuned such that thermomechanical requirements of the seed structure 622 are met, or thickness-related crystal growth parameters are controlled.

In some embodiments, the carrier layer 627 may have the thickness 704 that is greater than the thickness 702 of the seed layer 623. In some embodiments, the carrier layer 627 may have the thickness 704 that is at least five times greater than the thickness 702 of the seed layer 623. In some embodiments, the carrier layer 627 may have the thickness 704 in a range of about 1 μm to about 1000 μm. In some embodiments, the carrier layer 627 may have the thickness 704 in a range of about 150 μm to about 500 μm. In some embodiments, the carrier layer 627 has a thickness in a range of about 0.5 mm to about 6 mm or greater, such as about 500 μm to about 2 mm, such as about 2.2 mm to about 4 mm, such as 4.4 mm to about 6 mm, such as greater than 6 mm. In some embodiments, the seed layer 623 may have the thickness 704 in a range of about 0.2 μm to less than about 500 μm, such as less than about 200 μm, such as less than about 350 μm. In some embodiments, the one or more intervening structures may have a thickness of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to less than about 10 μm.

It may be desirable to provide the seed layer 623 with a high concentration of dopants to alter lattice strain during crystal growth processes, resulting in lower defects in the bulk crystalline material grown from the seed layer 623 and enhanced properties. By employing the seed structure 622 with the seed layer 623, the seed layer 623 with the thickness 702 may be highly doped (e.g., implanted or separated from a highly doped bulk material), as compared to a seed material that does not employ the seed structure 622 according to aspects of the present disclosure. In some examples, the carrier layer 627 may be doped. The concentration of dopants in the seed layer 623 or the carrier layer 627 may be in a range of greater than about $10^{15}$ $cm^{-3}$ to about $10^{19}$ $cm^{-3}$, such as about $10^{15}$ $cm^{-3}$ to about $10^{16}$ $cm^{-3}$, such as about $10^{17}$ $cm^{-3}$ to about $10^{19}$ $cm^{-3}$. An example dopant may include nitrogen.

The resistivity of the seed layer 623 or the carrier layer 627 including dopants may be in a range of about 0.015 Ω-cm to about 0.028 Ω-cm, such as greater than 0.001 Ω-cm, such as greater than 0.05 Ω-cm, such as greater than 0.01 Ω-cm, such as greater than 0.015 Ω-cm, such as greater than 0.02 Ω-cm, such as greater than 0.025 Ω-cm.

The seed structure 622 of FIGS. 7A and 7B may have a bonding energy dependent on the type of bond formed. In some embodiments, the bond may be based on one or more covalent bonds. In some embodiments, the bond may be based on a plasma-activated bond, such as an oxide layer (e.g., a native oxide layer or thermal oxide layer) that is plasma-activated and may or may not be removed to facilitate covalent bonding. In some embodiments, the bond may be facilitated by an ion-based bonding processes, such as ion beam etching. In some embodiments, the bond may be based on an electrostatic interaction at an interface between the carrier layer 627 and the seed layer 623. In some embodiments, the electrostatic interaction may be based on a van der Waals interaction.

C-mode scanning acoustic microscopy (C-SAM) may be used to determine bond quality and uniformity with respect to unbonded regions (e.g., voids) between the seed layer 623, the carrier layer 627, and the one or more intervening structures 729 in embodiments including the one or more intervening structures 729. The bonding energy may be quantified through destructive techniques, such as a double cantilever beam test (e.g., crack opening test or Maszara test). The bond energy is characterized based on geometries of the seed structure 622 (e.g., a total thickness or sum of the thickness 702 of the seed layer 623, the thickness 704 of the carrier layer 627, and the thickness 706 of the one or more intervening structures 729 as in FIG. 7A), material properties (e.g., an elastic modulus), the testing apparatus (e.g., the thickness of a fracturing component in a destructive testing technique), and the length of a resulting crack. In some examples, the bond energy may be greater than about 1000 $mJ/m^2$. In some examples, such as embodiments that do not employ a thermal treatment (e.g., annealing), bond energies may be lower depending on the bonding process employed. For example, an oxide-based bond may have a weaker bonding energy associated with electrostatic forces (e.g., Van der Waals forces), where the bonding energy may be in a range of less than about 10 $mJ/m^2$. A thermal treatment (e.g., annealing) may increase bonding energy, where bonding energy may be provided in a range of about 1000 $mJ/m^2$ to about 2000 $mJ/m^2$. A thermal treatment is discussed in reference to FIG. 9. In some examples, such as direct bonding examples as in the embodiment illustrated in FIG. 7B, the bonding energy may be in a range of about 1400 $mJ/m^2$ to greater than about 2000 $mJ/m^2$ following a thermal treatment.

The seed layer 623 may provide a surface opposite to the bond interface (e.g., a surface opposite of the one or more intervening structures 729 in FIG. 7A or a surface opposite to the bond 625 in FIG. 7B) that provides a growth surface for growing a crystalline silicon carbide structure 629 in a silicon carbide crystal growth process. The silicon carbide structure 629, represented by the dashed lines, will be grown from the seed structure 622 during a crystal growth process. In some embodiments, the silicon carbide crystal growth process may provide for growth of the crystalline silicon carbide structure 629 on the growth surface of the seed layer 623 at temperatures in a range of about 1500° C. to about 2500° C.

In the embodiments illustrated in FIGS. 7A and 7B, a seed holder 624 is used to hold the seed structure 622. In some embodiments, the seed holder 624 is fabricated from carbon (e.g., graphite). The attachment of the seed structure 622

(e.g., the carrier layer 627) to the seed holder 624 within the crystal growth system 612 may be made, for instance, by a uniform thermal contact. Various techniques may be used to implement a uniform thermal contact. For example, the seed structure 622 (e.g., the carrier layer 627) may be placed in direct physical contact with the seed holder 624, or an adhesive may be used to fix the seed structure 622 (e.g., the carrier layer 627) to the seed holder 624, so as to provide uniform conductive and/or radiative heat transfer over substantially the entire area between the seed structure 622 (e.g., the carrier layer 627) and the seed holder 624.

In some embodiments, the seed layer 623 may be bonded to the carrier layer 627 with the one or more of intervening structures 729 or layers as depicted in FIG. 7A. The one or more intervening structures 729 may include an oxide layer (e.g., a native oxide layer or a thermal oxide layer), ceramic forming polymers, or materials that further facilitate covalent bonding, such as a silicon layer. An example ceramic forming polymer may be polycarbosilane which may undergo polymer-to-ceramic conversion processes at temperatures between about 300° C. to 1600° C. In some embodiments, the one or more intervening structures 729 may have a thickness 706 of less than about 10 nm, such as about sub-1 nm (e.g., less than about 10 angstroms), such as about 1 nm to about 5 nm, such as about 5 nm to about 10 nm. In some embodiments, the one or more intervening structures 729 have the thickness 706 of about 200 nm to about 9 μm, such as about 200 nm to about 2 μm, such as about 2.2 μm to about 5 μm, such as about 5.5 μm to less than about 10 μm. In some embodiments, the one or more intervening structures 729 may be removed by a bonding process, such that the bond is a direct bond (e.g., the bond 625 depicted in FIG. 7B) between the carrier layer 627 and the seed layer 623. For instance, in the embodiment illustrated in FIG. 7A, the one or more intervening structures may be a thermal oxide, or an intentionally grown thicker oxide. The one or more intervening structures 729 may be plasma-activated to facilitate bonding between the seed layer and the carrier layer. The plasma-activation of the thermal oxide layer may not remove the thermal oxide layer in FIG. 7A. As illustrated in FIG. 7B, a native oxide layer (e.g., a naturally occurring oxide layer) that is plasma-activated to facilitate covalent bonding between the carrier layer 627 and the seed layer 623 may be removed by the plasma-activated bonding process. In embodiments that implement the one or more intervening structures 729, electrical characteristics of the interface between the one or more intervening structures 729 and/or the seed layer 623 and/or the carrier layer 627 are not constrained, whereas a thermal impedance may be controlled to provide an enhanced thermal interface (e.g., with low thermal impedance) between the seed layer 623 and the carrier layer 627.

As in FIG. 7B, the seed layer 623 is bonded (e.g., with the bond 625) directly to the carrier layer 627 without the use of the one or more intervening structures 729 of FIG. 7A. In some embodiments, the growth surface of the seed layer 623 may be a carbon face of the seed layer 623. In some embodiments, the seed layer 623 may include a silicon face that is directly bonded (e.g., with the bond 625) to the carrier layer 627. In some embodiments, such as embodiments including a monocrystalline carrier layer, the carbon face or the silicon face of the carrier layer 627 may include the bond 625 to the silicon face of the seed layer 623, where the carbon face of the seed layer 623 provides the growth surface for a crystal growth process.

Figure 8A:
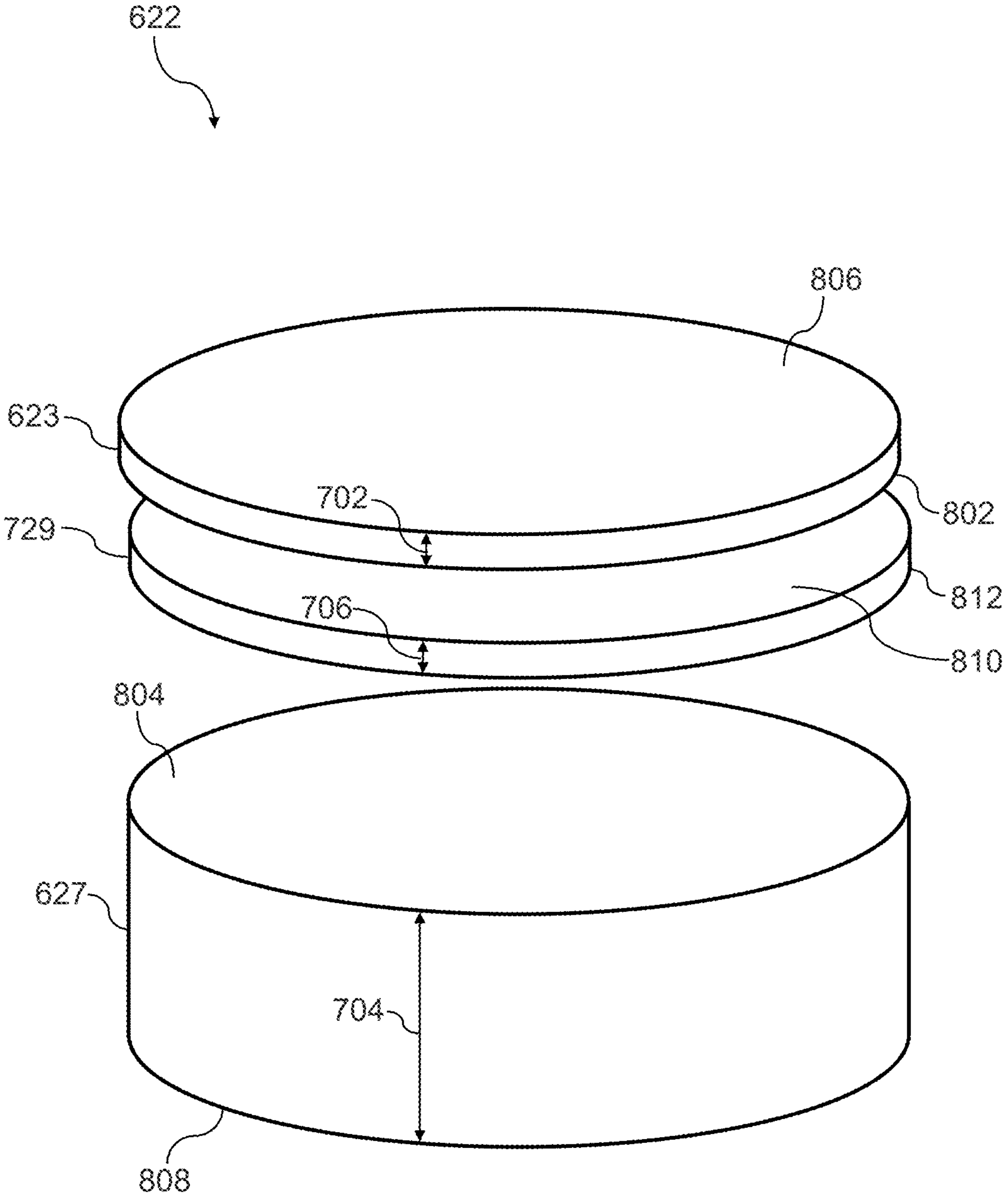
FIGS. 8A and 8B depict an exploded view of the seed structure according to aspects of the present disclosure.

FIG. 8A depicts an exploded view of the seed structure 622, including the seed layer 623, the one or more intervening structures 729, and the carrier layer 627. The seed layer 623 includes a first major surface 802 and a second major surface 806. The carrier layer 627 includes a first major surface 804 and a second major surface 808. The one or more intervening structures 729 includes a first major surface 810 and a second major surface 812.

Figure 8B:
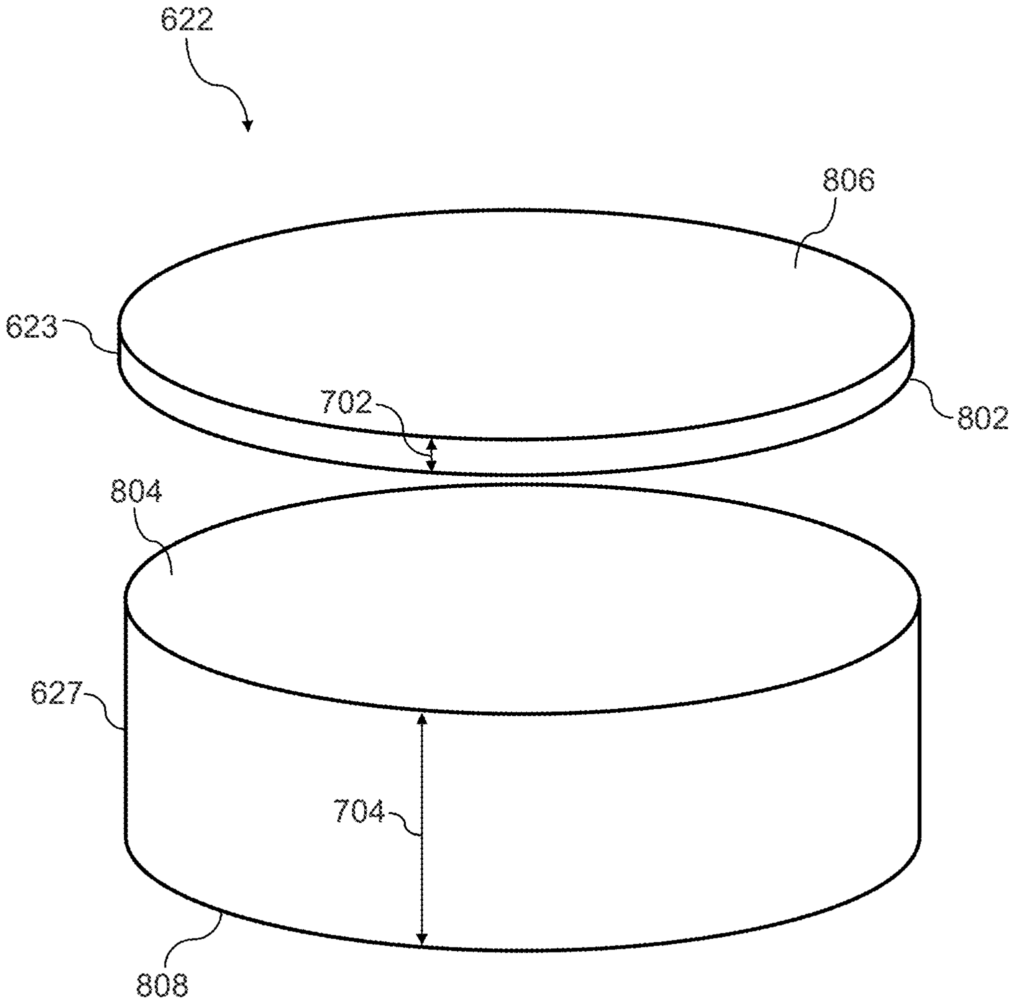

FIG. 8B depicts an exploded view of the seed structure 622, including the seed layer 623 and the carrier layer 627. The seed layer 623 includes the first major surface 802 and the second major surface 806. The carrier layer 627 includes the first major surface 804 and the second major surface 808.

In the embodiment depicted in FIG. 8A, the seed layer 623 may be bonded to the carrier layer 627 with the one or more of intervening structures 729. The first major surface 802 of the seed layer 623 may be bonded to the first major surface 810 of the one or more intervening structures 729. The one or more intervening structures 729 may include an oxide layer (e.g., a thermal oxide layer), a ceramic forming polymer, or materials that further facilitate covalent bonding, such as a silicon layer. An example ceramic forming polymer may be polycarbosilane which may undergo polymer-to-ceramic conversion processes at temperatures between about 300° C. to 1600° C. In some embodiments, the intervening structure 729 may have the thickness 706 of less than about 10 nm, such as about sub-1 nm (e.g., less than about 10 Angstroms), such as about 1 nm to about 5 nm, such as about 5 nm to about 10 nm. In some embodiments, the one or more intervening structures 729 have the thickness 706 of about 200 nm to about 9 μm, such as about 200 nm to about 2 μm, such as about 2.2 μm to about 5 μm, such as about 5.5 μm to less than about 10 μm. The second major surface 812 of the one or more intervening structures 729 may be bonded to the first major surface 804 of the carrier layer 627 to produce the seed structure 622.

In some embodiments, the one or more intervening structures 729 may be removed by a bonding process, such that the bond is a direct bond, as in FIG. 8B, between the first major surface 804 of the carrier layer 627 and the first major surface 802 of the seed layer 623. For instance, in the embodiment illustrated in FIG. 8A, the one or more intervening structures 729 may be a thermal oxide, or an intentionally grown thicker oxide. The one or more intervening structures 729 may be plasma-activated to facilitate bonding between the first major surface 802 of the seed layer and the first major surface 804 of the carrier layer. The plasma-activation of the thermal oxide layer may not remove the thermal oxide layer in FIG. 8A. As illustrated in FIG. 8B, a native oxide layer (e.g., a naturally occurring oxide layer) that is plasma-activated to facilitate covalent bonding between the first major surface 802 of the carrier layer 627 and the first major surface 804 of the seed layer 623 may be removed by the plasma-activated bonding process. The second major surface 808 of the carrier layer 627 is bonded to the seed holder used to position the seed structure 622 within the reaction crucible of a crystal growth system, such as the crystal growth system 612 of FIG. 6, or any of the crystal growth systems of FIGS. 10 and 11.

In some embodiments, the first major surface 802 of the seed layer 623 may be the silicon face. In some embodiments, the second major surface 806 of the seed layer 623 may be the carbon face. In some embodiments, the first major surface 804 of the carrier layer 627 may the silicon face. In some embodiments, the first major surface 804 of the carrier layer 627 may be the carbon face. That is, in some embodiments, the silicon face or the first major surface 802 of the seed layer 623 may be bonded (e.g., through the one or more intervening structures 729 as in FIG. 8A or directly bonded as in FIG. 8B) to the first major surface 804 of the carrier layer 627, which may be the carbon face or the silicon face of the carrier layer 627. In some embodiments, the second major surface 806 of the seed layer 623 is the carbon face.

In some embodiments, a plasma pretreatment process, an ion-based pretreatment process, a planarization process, or other pretreatment process may be performed on the first major surface 802 of the seed layer 623 and the first major surface 804 of the carrier layer 627 to prepare for bonding of the seed layer 623 and/or the carrier layer 627.

In some embodiments, surface preparation in anticipation of bonding (e.g., a plasma pretreatment process, an ion-based pretreatment process, a planarization process or other pretreatment process) and a bonding operation may be performed in situ in ultra-high vacuum processing environments.

The in-situ bonding process may facilitate bonding by modification of surface energy (e.g., plasma activation, ion beam modification). For example, the first major surface 802 of the seed layer 623 and the first major surface 804 of the carrier layer 627 may be activated in anticipation of direct bonding between the seed layer 623 and the carrier layer 627 with Ar ion beam irradiation which may employ an accelerating voltage of 1 kV and a current of 100 mA. Following the ion-assisted activation of the first major surface 802 of the seed layer 623 and the first major surface 804 of the carrier layer 627, the seed layer 623 and the carrier layer 627 may be directly bonded at room temperature (e.g., about 20° C. to about 25° C.) at the first major surface 802 and the first major surface 804 through contact under forces of about 1 MPa to about 2.5 MPa for a duration of about 180 seconds to about 300 seconds under ultra-high vacuum environments of about $5\times10^{-6}$ Pa to about $1\times10^{-8}$ Pa.

In some examples, the plasma activation of an oxide layer (e.g., a native or a thermal oxide layer) may include an activation duration of about 30 seconds to about 60 seconds, such as about 50 seconds to about 60 seconds, and an activation power of about 20 W. The first major surface 804 of the carrier layer 627, the seed layer 623 and the carrier layer 627 may then be bonded through an atmospheric pressure plasma activated bonding process or a low pressure plasma activated bonding process.

In some embodiments, surface preparation performed in situ in an ultra-high vacuum processing environment may include alignment of the first major surface 802 of the seed layer 623 and the first major surface 804 of the carrier layer. That is, in some embodiments, the silicon face or the first major surface 802 of the seed layer 623 may be aligned in anticipation of bonding to the first major surface 804 of the carrier layer 627, which may be the carbon face or the silicon face of the carrier layer 627.

In some embodiments, the carrier layer 627 may be silicon carbide. The seed layer 623 may be crystalline silicon carbide. In some embodiments, the carrier layer 627 may be polycrystalline silicon carbide and the seed layer 623 may be monocrystalline silicon carbide. That is, the carrier layer 627 may exhibit some amount of planar defects that separate regions of different crystalline orientation (e.g., grains) of the polytype of the crystal structure utilized. In some embodiments, the carrier layer 627 may be monocrystalline silicon carbide and the seed layer 623 may be monocrystalline silicon carbide. That is, the carrier layer 627 and the seed layer 623 may exhibit highly ordered crystalline structure (e.g., a singular grain) of the polytype of the crystal structure utilized. In some embodiments, the carrier layer 627 that is monocrystalline silicon carbide may differ from the monocrystalline silicon carbide seed layer 623 in axis orientation, purity, dopant concentration, or other properties.

The seed layer 623 and the carrier layer 627 may exhibit different thermomechanical properties or may otherwise influence crystal growth parameters through thickness-controlled parameters (e.g., diffusion, thermal impedance). For example, the seed structure 622 may need a prescribed thickness based on geometric and stiffness constraints of the seed layer 623 and the carrier layer 627 in order to undergo surface processing operations prior to implementation in a crystal growth system. As such, it may be desired that the seed layer 623 have the thickness 702 and the carrier layer 627 have the thickness 704. The one or more intervening structures 729 have the thickness 706 which may impact thermomechanical properties of the seed structure 622 represented in the embodiment illustrated in FIG. 7A. The thicknesses 702, 704 of the seed layer 623 and the carrier layer 627 may be tuned such that thermomechanical requirements of the seed structure 622 are met, or thickness-related crystal growth parameters are controlled.

In some embodiments, the carrier layer 627 may have the thickness 704 that is greater than the thickness 702 of the seed layer 623. In some embodiments, the carrier layer 627 may have the thickness 704 that is at least five times greater than the thickness 702 of the seed layer 623. In some embodiments, the carrier layer 627 may have the thickness 704 in a range of about 1 μm to about 1000 μm. In some embodiments, the carrier layer 627 may have the thickness 704 in a range of about 150 μm to about 500 μm. In some embodiments, the carrier layer 627 has a thickness in a range of about 0.5 mm to about 6 mm or greater, such as about 500 μm to about 2 mm, such as about 2.2 mm to about 4 mm, such as 4.4 mm to about 6 mm, such as greater than 6 mm. In some embodiments, the seed layer 623 may have the thickness 704 in a range of about 0.2 μm to less than about 500 μm, such as less than about 200 μm, such as less than about 350 μm.

It may be desirable to provide the seed layer 623 with a high concentration of dopants to alter lattice strain during crystal growth processes, resulting in lower defects in the bulk crystalline material grown from the seed layer 623 and enhanced electronic properties. By employing the seed structure 622 with the seed layer 623, the seed layer 623 with the thickness 702 may be highly doped (e.g., implanted or separated from a highly doped bulk material), as compared to a seed material that does not employ the seed structure 622 according to aspects of the present disclosure. The concentration of dopants in the seed layer 623 or the carrier layer 627 may be in a range of greater than about $10^{15}$ $cm^{-3}$ to about $10^{19}$ $cm^{-3}$, such as about $10^{15}$ $cm^{-3}$ to about $10^{16}$ $cm^{-3}$, such as about $10^{17}$ $cm^{-3}$ to about $10^{19}$ $cm^{-3}$. An example dopant may include nitrogen.

In some examples, the carrier layer 627 may be doped. The resistivity of the seed layer 623 or the carrier layer 627 including dopants may be in a range of about 0.015 Ω-cm to about 0.028 Ω-cm, such as greater than 0.001 Ω-cm, such as greater than 0.05 Ω-cm, such as greater than 0.01 Ω-cm, such as greater than 0.015 Ω-cm, such as greater than 0.02 Ω-cm, such as greater than 0.025 Ω-cm.

In embodiments that implement the one or more intervening structures 729, such as the embodiment depicted in FIG. 8A, electrical characteristics of the interface between the one or more intervening structures 729 and/or the seed layer 623 and/or the carrier layer 627 are not constrained, whereas a thermal impedance may be controlled to provide an enhanced thermal interface (e.g., with low thermal impedance) between the seed layer 623 and the carrier layer 627.

The seed structure 622 of FIGS. 8A and 8B may have a bonding energy dependent on the type of bond formed in the bonding process. In some embodiments, the bond may be based on one or more covalent bonds. In some embodiments, the bond may be based on a plasma-activated bond, such as an oxide layer (e.g., a native oxide layer or a thermal oxide layer) that is plasma-activated to facilitate bonding. In some embodiments, the bond may be facilitated by ion-based bonding processes, such as ion beam etching. In some embodiments, the bond may be based on an electrostatic interaction at an interface (e.g., at the major surface 802 and the major surface 804) between the carrier layer 627 and the seed layer 623. In some embodiments, the electrostatic interaction may be based on a van der Waals interaction.

C-mode scanning acoustic microscopy (C-SAM) may be used to determine bond quality and uniformity with respect to unbonded regions (e.g., voids) between the seed layer 623, the carrier layer 627, and the one or more intervening structures 729, in embodiments including the one or more intervening structures 729. The bonding energy may be quantified through destructive techniques, such as a double cantilever beam test (e.g., crack opening or Maszara test). The bond energy is characterized based on geometries of the seed structure 622 (e.g., a total thickness), material properties (e.g., an elastic modulus), the testing apparatus (e.g., the thickness of a fracturing component in a destructive testing technique), and the length of a resulting crack. In some examples, the bond energy may be greater than about 1000 $mJ/m^2$. In some examples, such as embodiments that do not employ a thermal treatment (e.g., annealing), bond energies may be lower depending on the bonding process employed. For example, an oxide-based bond may have a weaker bonding energy associated with electrostatic forces (e.g., Van der Waals forces), where the bonding energy may be in a range of less than about 10 $mJ/m^2$. A thermal treatment (e.g., annealing) may increase bonding energy, where bonding energy may be provided in a range of about 1000 $mJ/m^2$ to about 2000 $mJ/m^2$. A thermal treatment is discussed in reference to FIG. 9. In some examples, such as direct bonding examples as in the embodiment illustrated in FIG. 8B, the bonding energy may be in a range of about 1400 $mJ/m^2$ to greater than about 2000 $mJ/m^2$ following a thermal treatment.

The seed layer 623 may provide the growth surface on the second major surface 806 opposite to the bond interface (e.g., at the major surface 802 and the major surface 804). The growth surface, or the second major surface 806 of the seed layer 623 may be the carbon face. In some embodiments, the silicon carbide crystal growth process may provide for growth of the crystalline silicon carbide structure on the growth surface of the seed layer 623 at temperatures in a range of about 1500° C. to about 2500° C.

Figure 9:
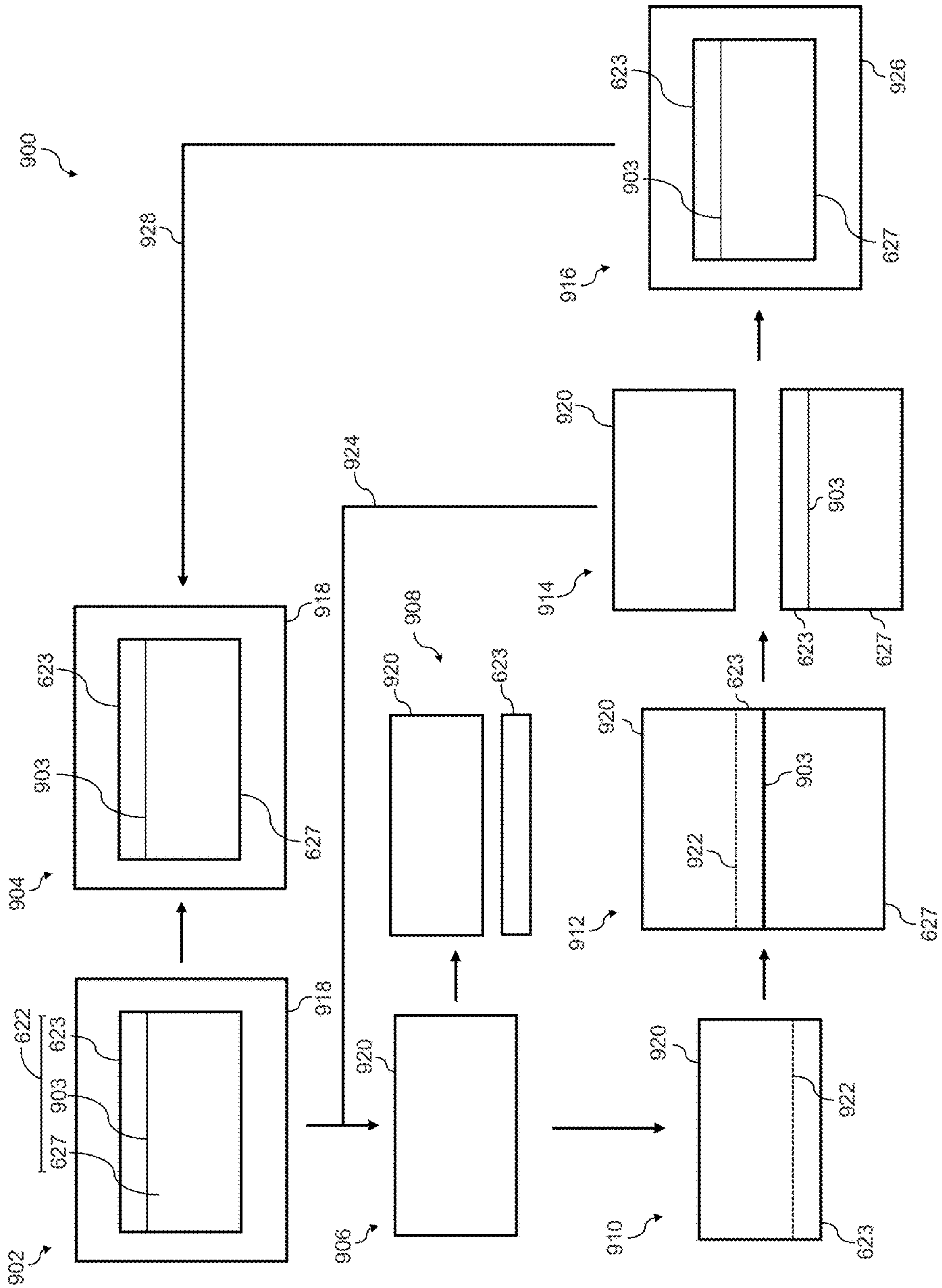
FIG. 9 is an overview of an example method according to aspects of the present disclosure.

FIG. 9 is an example method 900 to provide the seed structure 622 to a crystal growth system 918. At 902, the method 900 includes providing the seed structure 622 with an interface 903 (e.g., the seed structure 622 with the one or more intervening structures of FIGS. 7A and 8A, or the seed structure 622 with the bond 625 of FIGS. 7B and 8B) between the carrier layer 627 and the seed layer 623 to a crystal growth system 918. That is, in some embodiments, the interface 903 may include an oxide layer (e.g., a native oxide layer or a thermally grown oxide layer), a ceramic forming polymer, or materials that further facilitate covalent bonding, such as a silicon layer. An example ceramic forming polymer may be polycarbosilane which may undergo polymer-to-ceramic conversion processes at temperatures between about 300° C. to 1600° C. In some embodiments, the one or more intervening structures 729 have a thickness of less than about 10 nm, such as about sub-1 nm (e.g., less than about 10 angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to less than about 10 μm. At 904, the method includes conducting a crystal growth process in the crystal growth system 918 using the seed layer 623 of the structure 622 as a growth surface. In some embodiments, the crystal growth process may provide for growth of the crystalline structure on the growth surface of the seed layer 623 at temperatures in a range of about 1500° C. to about 2500° C. In some embodiments, the growth surface is the carbon face of the seed layer 623.

In some embodiments, the carrier layer 627 may be silicon carbide. The seed layer 623 may be crystalline silicon carbide. In some embodiments, the carrier layer 627 may be polycrystalline silicon carbide and the seed layer 623 may be monocrystalline silicon carbide. In some embodiments, the carrier layer 627 may be monocrystalline silicon carbide and the seed layer 623 may be monocrystalline silicon carbide. In some embodiments, the interface 903 may include one or more covalent bonds. In some embodiments, the interface 903 may include a plasma-activated bond, such as an oxide layer (e.g., a native oxide layer or a thermal oxide layer) that is plasma-activated to facilitate bonding. In some embodiments, the interface 903 may be facilitated by ion-based bonding processes, such as ion beam etching. In some embodiments, the interface 903 may include an electrostatic interaction at the interface 903 between the carrier layer 627 and the seed layer 623. In some embodiments, the electrostatic interaction may be based on a van der Waals interaction.

In some embodiments, the carrier layer 627 may have a thickness that is greater than a thickness of the seed layer 623. In some embodiments, the carrier layer 627 may have a thickness that is at least five times greater than a thickness of the seed layer 623. In some embodiments, the carrier layer 627 may have a thickness in a range of about 1 μm to about 1000 μm. In some embodiments, the carrier layer 627 may have a thickness in a range of about 150 μm to about 500 μm. In some embodiments, the carrier layer 627 has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer 623 may have a thickness in a range of less than about 0.2 μm to less than about 500 μm, such as less than about 200 μm, such as less than about 350 μm. In some embodiments, the interface 903 including the one or more intervening structures 729, as in FIGS. 7A and 8A, may have a thickness in a range of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to less than about 10 μm.

In some embodiments, such as at 906, the method 900 may include providing a bulk seed structure 920, such as a bulk seed structure of crystalline silicon carbide. In some embodiments, such as at 908, the method may include separating the seed layer 623 from the bulk seed structure 920. Separation techniques may include mechanical separation mechanisms, such as cutting the bulk seed structure 920 using wire saws, electrical discharge machining, or other suitable separation technique.

In some embodiments, such as at 910, the method 900 may include inducing a damage region 922 below a surface of the bulk seed structure 920. The area below the induced damage region 922 may become the seed layer 623. In some embodiments, the induced damage region 922 is a laser-induced damage region. In some examples, the laser-induced damage region may include laterally spaced damage patterns that form connected cracks along the crystal plane to facilitate separation. In some examples, the laser-induced damage region may create a continuous amorphous layer using a high density of damage patterns. In some embodiments, the induced damage region 922 is an implanted species induced damage region.

Additionally, the thickness of the seed layer 623 may impact separation techniques such as induced-damage separation techniques (e.g., laser-induced or an implanted species damage regions). For instance, separation techniques relying on optical properties of the bulk seed structure 920 may experience optical aberrations in the bulk seed structure 920 that inhibit induced-damage separation techniques past a thickness threshold of about 0.5 mm. Further, the refractive index of the bulk seed structure 920 (e.g., silicon carbide) and a surrounding medium (e.g., air) may limit focusing depth of an emission of radiation. Still further, the radiation-based separation technique (e.g., laser-based) relies on non-linear absorption and requires the use of a wavelength in the IR range (e.g., about 700 nm to 1 mm, such as about 1064 nm) to allow focusing inside the material. Nitrogen has an absorption peak in this range that significantly increases the laser power required, particularly as depth is increased. This may lead to a larger damage region at increased depths and increased power requirements of the laser.

Accordingly, it may be desirable to provide the seed layer 623 with a high concentration of dopants to alter lattice strain during crystal growth processes, resulting in lower defects in the bulk crystalline material grown from the seed layer 623 and enhanced electronic properties. By employing the method 900, specifically inducing a damage region 922 such as at 910, the seed layer 623 with a reduced thickness may be highly doped (e.g., implanted or separated from a highly doped bulk material, such as the bulk seed structure 920), as compared to a seed material that does not employ the seed structure 622 with the seed layer 623 and the carrier layer 627, according to aspects of the present disclosure. In some examples, the carrier layer 627 may be doped. The resistivity of the seed layer 623 or the carrier layer 627 including dopants may be in a range of about 0.015 Ω-cm to about 0.028 Ω-cm, such as greater than 0.001 Ω-cm, such as greater than 0.05 Ω-cm, such as greater than 0.01 Ω-cm, such as greater than 0.015 Ω-cm, such as greater than 0.02 Ω-cm, such as greater than 0.025 Ω-cm. The concentration of dopants in the seed layer 623 or the carrier layer 627 may be in a range of greater than about $10^{15}$ $cm^{-3}$ to about $10^{19}$ $cm^{-3}$, such as about $10^{15}$ $cm^{-3}$ to about $10^{16}$ $cm^{-3}$, such as about $10^{17}$ $cm^{-3}$ to about $10^{19}$ $cm^{-3}$. An example dopant may include nitrogen.

At 912, the method 900 includes providing the carrier layer 627 and creating the interface 903 between the seed layer 623 and the carrier layer 627. Creating the interface 903 may include a plasma pretreatment process, planarization process or other pretreatment process (not pictured) performed on the surface(s) of the seed layer 623 and/or the carrier layer 627 to prepare for bonding operations at the interface of the seed layer 623 and the carrier layer 627. In some embodiments, the interface 903 is a direct bond between the seed layer 623 and the carrier layer, as depicted in FIGS. 7B and 8B. In some embodiments, the interface 903 is a bond between the seed layer 623, the carrier layer 627, and one or more intervening structures (e.g., the one or more intervening structures 729 of FIGS. 7A and 8A). In some embodiments, the interface 903 may have a bonding energy dependent on the type of bond formed in the interface 903. In some embodiments, the interface 903 may be based on one or more covalent bonds. In some embodiments, the interface 903 may be based on a plasma-activated bond. In some embodiments, the interface 903 may be facilitated by ion-based bonding processes, such as ion beam etching. In some embodiments, the interface 903 may be based on an electrostatic interaction at the interface 930 between the carrier layer 627 and the seed layer 623. In some embodiments, the electrostatic interaction may be based on a van der Waals interaction.

In some embodiments, surface preparation in anticipation of bonding (e.g., a plasma pretreatment process, an ion-based pretreatment process, a planarization process or other pretreatment process) and a bonding operation (e.g., creating the interface 903) may be performed in situ in ultra-high vacuum processing environments.

For instance, the in-situ bonding process may facilitate bonding by modification of surface energy (e.g., plasma activation, ion beam modification). For example, the seed layer 623 and the carrier layer 627 may be activated in anticipation of direct bonding. Ar ion beam irradiation, for instance, may employ an accelerating voltage of 1 kV and a current of 100 mA. Following the ion-assisted activation of the first major surface 802 of the seed layer 623 and the first major surface 804 of the carrier layer 627, the seed layer 623 and the carrier layer 627 may be directly bonded at room temperature (e.g., about 20° C. to about 25° C.) through contact under forces of about 1 MPa to about 2.5 MPa for a duration of about 180 seconds to about 300 seconds under ultra-high vacuum environments of about $5\times10^{-6}$ Pa to about $1\times10^{-8}$ Pa.

In some examples, the plasma activation of an oxide layer (e.g., a native or a thermal oxide layer) may include an activation duration of about 30 seconds to about 60 seconds, such as about 50 seconds to about 60 seconds, and an activation power of about 20 W. The seed layer 623 and the carrier layer 627 may then be bonded through an atmospheric pressure plasma activated bonding process or a low pressure plasma activated bonding process.

In some embodiments, surface preparation performed in situ in an ultra-high vacuum processing environment may include alignment of the first major surface of the seed layer 623 and the first major surface of the carrier layer. That is, in some embodiments, the silicon face or the first major surface of the seed layer 623 may be aligned in anticipation of bonding to the first major surface of the carrier layer 627, which may be the carbon face or the silicon face of the carrier layer 627.

In some embodiments, creating the interface 903 between the seed layer 623 and the carrier layer 627 may include a thermal treatment (e.g., annealing) to restructure the atoms of the interface 903. The thermal treatment (e.g., annealing) may increase the bonding energy of the interface 903 beyond the bonding energy that may be created without the thermal treatment. The thermal treatment of the interface 903 may occur in a temperature range of about 225° C. to about 1650° C., such as about 225° C. to about 350° C., such as about 385° C. to about 475° C., such as about 525° C. to about 1250° C., such as about 1375° C. to about 1650° C. The thermal treatment (e.g., annealing) may be a diffusion-based process where the desired bonding energy is achieved through alterations to the thermal treatment, such as environmental conditions, a treatment duration, temperature ramp up rate, or temperature ramp down rate. The thermal treatment may be conducted for a duration of 15 minutes to about 4 hours, such as about 15 minutes to about 30 minutes, such as about 30 minutes to about 1 hour, such as about 1 hour to about 3 hours, such as about 3 hours to about 4 hours. In some embodiments, the thermal treatment (e.g., annealing) is performed in inert ambient conditions. Nitrogen, by non-limiting example, may be used to create an inert ambient processing environment. In low temperature thermal treatments, such as thermal treatments provided in a temperature range of about 225° C. to about 475° C., an inert thermal treatment environment may not be required.

C-mode scanning acoustic microscopy (C-SAM) may be used to determine bond quality and uniformity with respect to unbonded regions (e.g., voids) of the interface 903. The bonding energy of the interface 903 may be quantified through destructive techniques, such as a double cantilever beam test (e.g., crack opening or Maszara test). The bond energy is characterized based on geometries of the seed structure 622 (e.g., a total thickness), material properties (e.g., an elastic modulus), the testing apparatus (e.g., the thickness of a fracturing component in a destructive testing technique), and the length of a resulting crack. In some examples, the bond energy may be greater than about 1000 $mJ/m^2$. In some examples, such as embodiments that do not employ a thermal treatment (e.g., annealing), bond energies may be lower depending on the bonding process employed. For example, an oxide-based bond may have a weaker bonding energy associated with electrostatic forces (e.g., Van der Waals forces), where the bonding energy may be in a range of less than about 10 $mJ/m^2$. A thermal treatment (e.g., annealing) may increase bonding energy, where bonding energy may be provided in a range of about 1000 $mJ/m^2$ to about 2000 $mJ/m^2$. A thermal treatment is discussed in reference to FIG. 9. In some examples, such as direct bonding examples as in the embodiment illustrated in FIG. 8B, the bonding energy may be in a range of about 1400 $mJ/m^2$ to greater than about 2000 $mJ/m^2$ following a thermal treatment.

At 914, the method 900 includes separating the bulk seed structure 920 from the seed layer 623 at least partially along the induced damage region 922 such that the seed layer 623 remains bonded to the carrier layer 627 through the interface 903 after separating the seed layer 623 from the bulk seed structure 920. As represented by the arrow 924, the bulk seed structure 920 may be employed by the method 900 in further iterations.

At 916, the method includes subjecting the seed structure 622 to one or more surface processing operations that are performed on the seed layer 623 with the interface 903 and the carrier layer 627. In some embodiments, the surface processing operations include one or more of grinding, polishing, chemical mechanical polishing, lapping, or electrochemical mechanical polishing. As represented by the arrow at 928, the method 900 may include providing the seed structure 622 with the seed layer 623, the interface 903, and the carrier layer 627 to a crystal growth system 918 where a crystal growth process may be conducted.

After the crystal growth process is conducted, the carrier layer 627 may be separated at or near the interface 903 from the bulk crystalline material grown on the seed structure 622 in the crystal growth process conducted at 904. In some examples, the separation may include separating the carrier layer 627 at or near the interface 903 from the bulk crystalline material grown on the seed layer 623 in the crystal growth process by a separation process using wire saws, electrical discharge machining, or other suitable separation technique such that the carrier layer 627 is removed from the seed layer 623 and a resulting bulk crystalline material grown on the seed layer 623 in a crystal growth process. In some examples, the separation may include separating the carrier layer 627 at or near the interface 903 from the bulk crystalline material grown on the seed layer 623 in the crystal growth process by a separation process including repeatedly removing (e.g., laser-based separation) thin portions of the bulk crystalline material grown on the seed layer 623 in a crystal growth process toward the interface 903 between the seed layer 623 and the carrier layer 627. The seed layer 623 may then be separated from the carrier layer 627 at or near the interface 903 through a more precise, less damaging separation technique (e.g., laser-based separation) relative to a mechanical cutting processes. In any suitable separation technique, the carrier layer 627 may thus be reused in subsequent iterations of the method 900. In some examples, reusing the carrier layer 627 in subsequent iterations of the method 900 may include a planarization or surface processing operation performed on the carrier layer 627.

Figure 10:
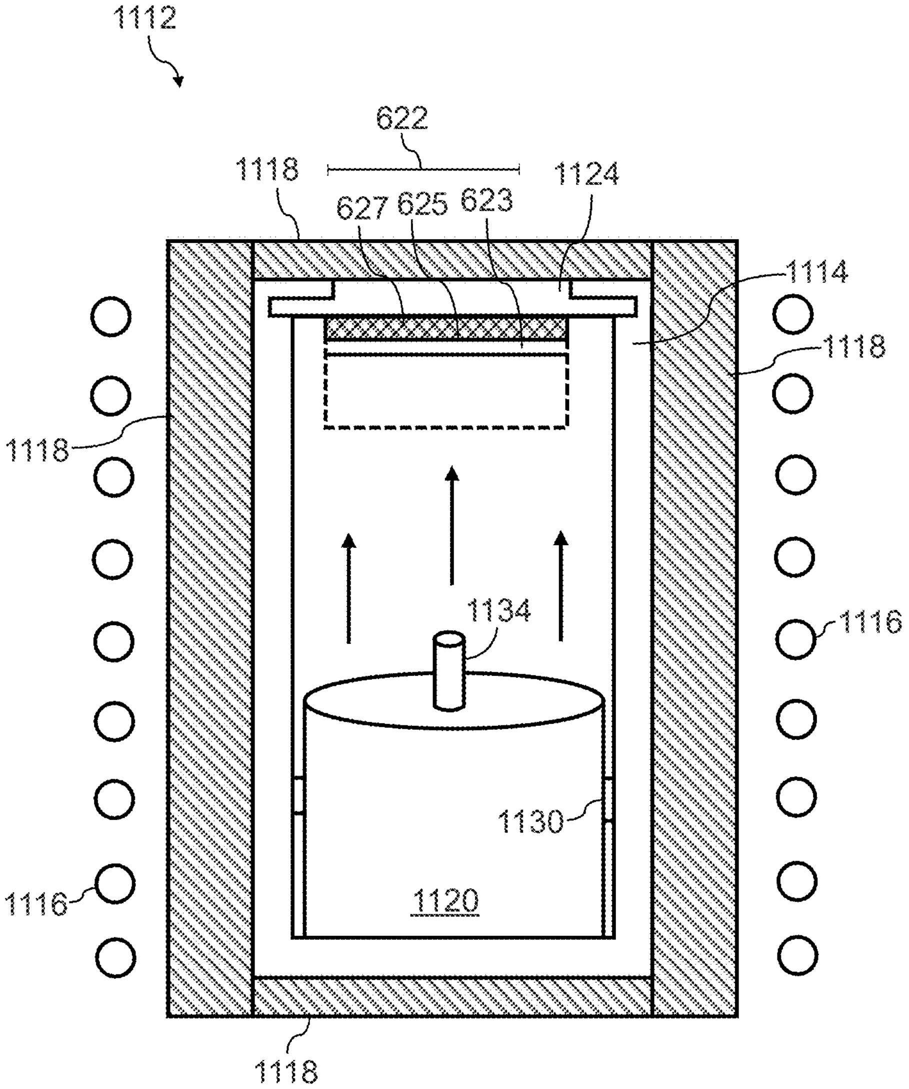
FIG. 10 depicts an example system according to aspects of the present disclosure.

FIG. 10 is an example crystal growth system 1100 that may be similar to that shown in FIG. 6, but may also include an inlet 1134 for introducing a dopant (e.g., $N_2$) to the reaction crucible 1114. The inlet 1134, may be, for example, a tube, pipe, vent, or the like. In some embodiments, the source material 1120 may surround the inlet 1134. For example, in some embodiments, the source material 1120 may include a channel through which the inlet 1134 is provided. In other embodiments, the source material 1120 may include a plurality of subcomponents (attached or detached) which surround the inlet 1134. The inlet 1134 may be connected to a dopant-containing gas source (not shown) and configured to introduce the dopant-containing gas to the reaction crucible 1114. An example of a dopant-containing gas is nitrogen.

Figure 11:
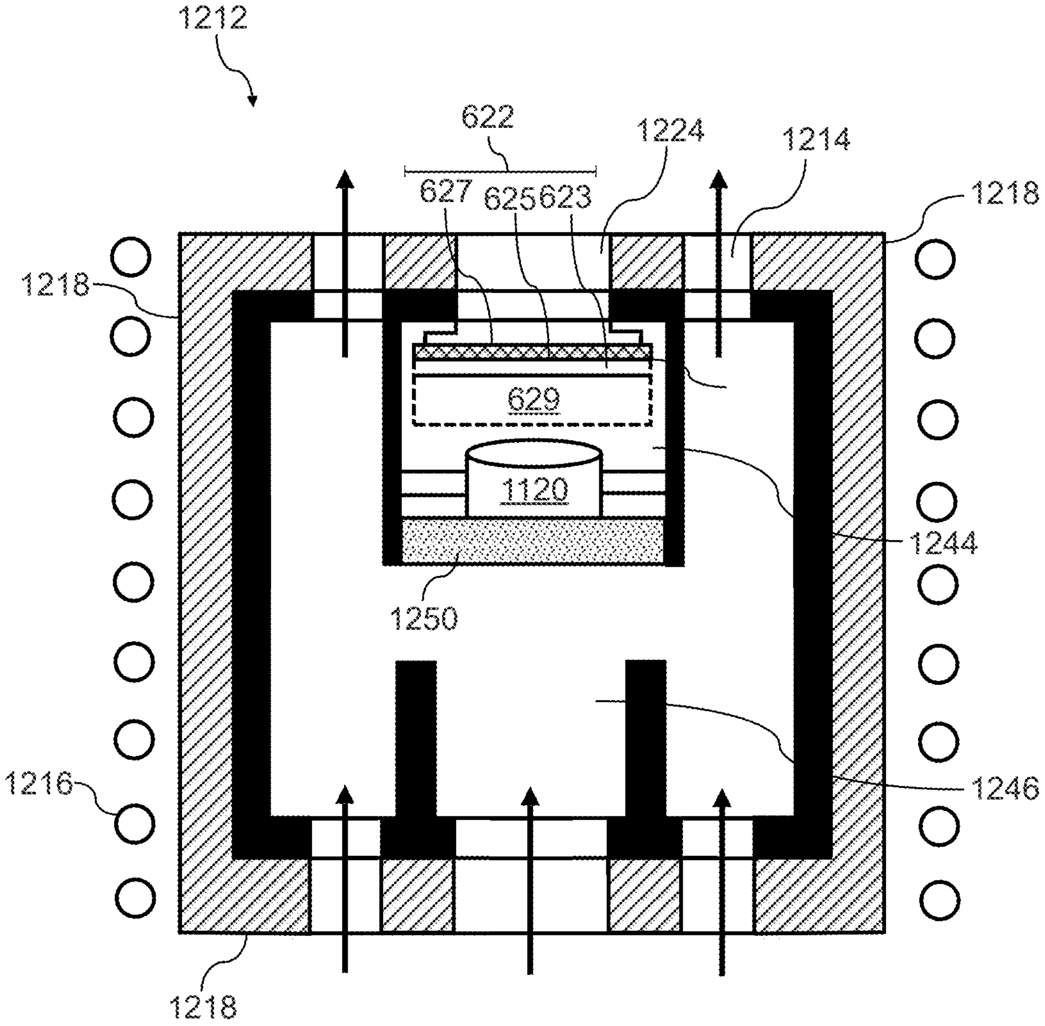
FIG. 11 depicts an example system according to aspects of the present disclosure.

In another example embodiment, shown in FIG. 11, the crystal growth system 1242 may be a continuous feed PVT (CF-PVT) system. In a CF-PVT system, such as the crystal growth system 1242 of FIG. 11, the reaction crucible may include an upper chamber 1244 and a lower chamber 1246. The upper chamber 1244 may include the source material 1220 and the seed structure 622. The upper chamber 1244 may be separated from the lower chamber 1246 by a foamed structure 1250. The foamed structure 1250 may be formed, for example, from a gas-permeable graphite foam. The source material 1220 may be placed on the foamed structure 1250 within the upper chamber 1244. A gaseous silicon source (e.g., trimethylsilane diluted in argon) may be supplied to the lower chamber 1246. As the gaseous silicon source flows through the foamed structure 1250, it may react with a carbon source within the foamed structure 1250 (e.g., graphite) to form silicon carbide. A CF-PVT system, such as the crystal growth system 1242 of FIG. 11, combines a PVT process for the growth of single crystals and high temperature chemical vapor deposition (HTCVD) processes for the in situ formation and continuous feeding of a high purity polycrystalline source. A CF-PVT system, such as the crystal growth system 1242 of FIG. 11, may be particularly useful for growing 3C silicon carbide.

In some embodiments, the upper chamber 1244 or the lower chamber 1246 of the reaction crucible may be subjected to the treatment process of the graphite structure 1226 according to aspects of the present disclosure. In some embodiments, the source material holder 1230 may be subjected to the treatment process of the graphite structure 1226 according to aspects of the present disclosure. In some embodiments, the foamed structure 1250 may be subjected to the treatment process of the graphite structure 1226 according to aspects of the present disclosure.

The crystal growth systems 1132, 1212 of FIGS. 10 and 11 include the seed structure 622, the seed structure 622 may include the seed layer 623 that is directly bonded to the carrier layer 627, or an interface with one or more intervening structures may be provided to the seed layer 623 or the carrier layer 627. The bond may be based on interactions or bonding operations performed at an interface between the seed layer 623 and the carrier layer 627, with no intervening structures or layers at the interface after the bonding process is completed.

In some embodiments, the carrier layer 627 may be silicon carbide. The seed layer 623 may be crystalline silicon carbide. In some embodiments, the carrier layer 627 may be polycrystalline silicon carbide and the seed layer 623 may be monocrystalline silicon carbide. In some embodiments, the carrier layer 627 may be monocrystalline silicon carbide and the seed layer 623 may be monocrystalline silicon carbide. In some embodiments, the bond may be based on one or more covalent bonds. In some embodiments, the bond may be based on a plasma-activated bond, such as an oxide layer (e.g., native oxide layer) that is plasma-activated to facilitate bonding. In some embodiments, the bond may be facilitated by ion-based bonding processes, such as ion beam etching. In some embodiments, the bond may be based on an electrostatic interaction at an interface between the carrier layer 627 and the seed layer 623. In some embodiments, the electrostatic interaction may be based on a van der Waals interaction.

In some embodiments, the carrier layer 627 may have a thickness that is greater than a thickness of the seed layer 623. In some embodiments, the carrier layer 627 may have a thickness that is at least five times greater than a thickness of the seed layer 623. In some embodiments, the carrier layer 627 may have a thickness in a range of about 1 μm to about 1000 μm. In some embodiments, the carrier layer 627 may have a thickness in a range of about 150 μm to about 500 μm. In some embodiments, the carrier layer 627 has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer 623 may have a thickness in a range of about 0.2 μm to less than about 500 μm, such as less than about 200 μm, such as less than about 350 μm. In some embodiments, the seed structure 622 may additionally include one or more intervening layers, such as the one or more intervening structure 729 of FIGS. 7A and 8A. The one or more intervening structures may have a thickness of less than about 10 nm, such as about sub-1 nm (e.g., less than about 10 Angstroms), such as about 1 nm to about 5 nm, such as about 5 nm to about 10 nm. In some embodiments, the one or more intervening structures have a thickness of about 200 nm to about 9 μm, such as about 200 nm to about 2 μm, such as about 2.2 μm to about 5 μm, such as about 5.5 μm to about 10 μm. The seed structure 622, comprising the seed layer 623, the carrier layer 627, and the one or more intervening structures 729 are discussed in more detail in reference to FIGS. 6-8.

The seed layer 623 may provide a growth surface for growing a crystalline silicon carbide structure 629 in a silicon carbide crystal growth process. A silicon carbide structure 629, represented by the dashed lines, will be grown from the seed structure 622 during a crystal growth process. In some embodiments, the silicon carbide crystal growth process may provide for growth of the crystalline silicon carbide structure on the growth surface of the seed layer at temperatures in a range of about 1500° C. to about 2500° C.

In any of the embodiments shown in FIGS. 6, 10-11, the crystal growth systems and/or the reaction crucible 114 may be implemented in a number of different geometries, or any suitable configurations, and may hold the source material accordingly. Thus, while embodiments of the present disclosure may be illustrated with certain designs of the reaction crucible, the scope of the present disclosure is not limited to such designs but will find application in different crystal growth system designs using many different types of reaction crucibles.

Figure 12:
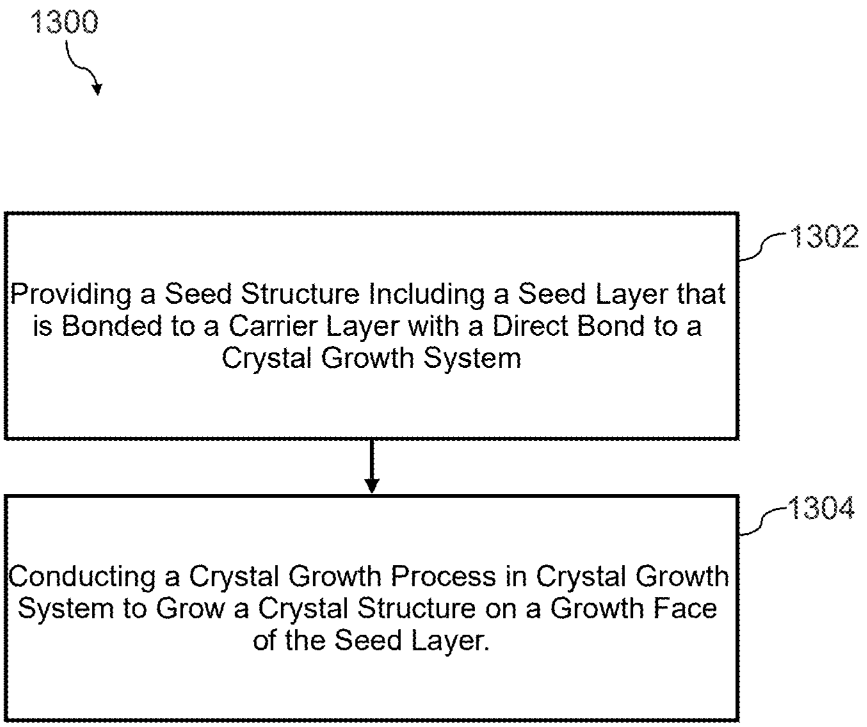
FIG. 12 depicts a flowchart according to an example method of the present disclosure.

FIG. 12 depicts a flow chart diagram of an example method 1300 according to aspects of the present disclosure. FIG. 12 is intended to represent structures for identification and description and is not intended to represent the structures to physical scale. The method 1300 depicts operations in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 1302, the method 1300 includes providing a seed structure to a crystal growth system. The seed structure includes a seed layer that is bonded to the carrier layer with a bond. In some embodiments, the seed layer may be bonded to the carrier layer with one or more intervening structures. In some embodiments, the carrier layer may be polycrystalline silicon carbide and the seed layer may be monocrystalline silicon carbide. In some embodiments, the carrier layer may be monocrystalline silicon carbide and the seed layer may be monocrystalline silicon carbide.

The bond may be based on interactions or bonding operations performed at an interface between the seed layer and the carrier layer, with no intervening structures or layers at the interface after the bonding process is completed. In some embodiments, the bond may be based on interactions or bonding operations performed at an interface between the seed layer and the carrier layer, with one or more intervening structures or layers at the interface after the bonding process is completed. In some embodiments, the bond may be based on one or more covalent bonds. In some embodiments, the bond may be a plasma-activated bond. In some embodiments, the bond may include an oxide layer (e.g., native oxide layer) that is plasma-activated to facilitate bonding. In some embodiments, the bond may be facilitated by ion-based bonding processes, such as ion beam etching. In some embodiments, the bond may be based on an electrostatic interaction at an interface between the carrier layer and the seed layer. In some embodiments, the electrostatic interaction may be based on a van der Waals interaction.

In some embodiments, the seed structure further includes an amorphous bonding region at an interface between the carrier layer and the seed layer. In some embodiments, the amorphous bonding region has a thickness in a range of about 5 nm to about 10 nm. In some embodiments, the amorphous bonding region may be thermally treated (e.g., annealed) to provide an energetic incentive to restructure atoms in the amorphous region into a more ordered structure, which may increase the bonding energy of the bond. In some embodiments, the carrier layer has a thickness that is greater than a thickness of the seed layer. In some embodiments, the carrier layer has a thickness that is at least five times greater than a thickness of the seed layer. In some embodiments, the carrier layer has a thickness in a range of about 1 μm to about 1000 μm. In some embodiments, the carrier layer has a thickness in a range of about 150 μm to about 500 μm. In some embodiments, the carrier layer has a thickness in a range of about 0.5 mm to about 6 mm or greater, such as about 500 μm to about 2 mm, such as about 2.2 mm to about 4 mm, such as 4.4 mm to about 6 mm, such as greater than about 6 mm. In some embodiments, the seed layer has a thickness in a range of about 0.2 μm to less than about 500 μm, such as less than about 200 μm, such as less than about 350 μm.

The method 1300 optionally includes providing a bulk seed structure of crystalline silicon carbide and separating the seed layer from the bulk seed structure. The separation optionally includes inducing a damage region beneath a surface of the bulk seed structure. The bulk seed structure may then be bonded to the carrier layer with a bond. The method may optionally include a plasma pretreatment process, planarization process or other pretreatment process performed on the surface(s) of the seed layer and/or the carrier layer to prepare for bonding operations at the interface of the seed layer and the carrier layer. The bulk seed structure with an induced damage region that is directly bonded to the carrier layer may then be separated, at least partially, along the induced damage region such that a portion of the bulk seed structure (e.g., the seed layer) remains on the carrier layer through the bond. The method 1300 may optionally include surface processing operations on the surface of the seed layer, such as one or more of an operation involving grinding, polishing, chemical mechanical polishing, lapping, or electrochemical mechanical polishing.

At 1304, the method 1300 includes conducting a crystal growth process to grow a crystalline silicon carbide structure on a growth surface of the seed layer. In some embodiments, the silicon carbide crystal growth process provides for growth of the crystalline silicon carbide structure on the growth surface of the seed layer at temperatures in a range of about 1500° C. to about 2500° C.

Example aspects of the present disclosure are set forth below. Any of the below features or examples may be used in combination with any of the embodiments or features provided in the present disclosure.

In an aspect, the present disclosure provides an example seed structure for a silicon carbide crystal growth system. The seed structure includes a carrier layer. The carrier layer is silicon carbide. The seed structure includes a seed layer bonded to the carrier layer with a bond. The seed layer is crystalline silicon carbide. The seed layer provides a growth surface for growing a crystalline silicon carbide structure in a silicon carbide crystal growth process.

In some implementations of the example seed structure, the carrier layer is polycrystalline silicon carbide and the seed layer is monocrystalline silicon carbide.

In some implementations of the example seed structure, the carrier layer is monocrystalline silicon carbide and the seed layer is monocrystalline silicon carbide.

In some implementations of the example seed structure, the bond includes one or more covalent bonds.

In some implementations of the example seed structure, the bond includes a plasma-activated bond.

In some implementations of the example seed structure, the bond includes an electrostatic interaction at an interface between the carrier layer and the seed layer.

In some implementations of the example seed structure, the electrostatic interaction is a van der Waals interaction.

In some implementations of the example seed structure, the bond is a direct bond between the carrier layer and the seed layer without an intervening structure.

In some implementations of the example seed structure, the bond provides an interface between one or more of the carrier layer, the seed layer, and one or more intervening structures.

In some implementations of the example seed structure, the one or more intervening structures are a ceramic forming polymer or a silicon layer.

In some implementations of the example seed structure, the one or more intervening structures are an oxide layer.

In some implementations of the example seed structure, the oxide layer has a thickness of about 1 nm to about 5 nm.

In some implementations of the example seed structure, the oxide layer has a thickness of about 5 nm to about 10 nm.

In some implementations of the example seed structure, the one or more intervening structures has a thickness of about 1 nm to about 5 μm.

In some implementations of the example seed structure, the one or more intervening structures has a thickness of about 200 nm to about 2 μm.

In some implementations of the example seed structure, the carrier layer has a thickness that is greater than a thickness of the seed layer.

In some implementations of the example seed structure, the carrier layer has a thickness that is at least five times greater than a thickness of the seed layer.

In some implementations of the example seed structure, the carrier layer has a thickness in a range of about 1 μm to about 1000 μm.

In some implementations of the example seed structure, the carrier layer has a thickness in a range of about 150 μm to about 500 μm.

In some implementations of the example seed structure, the seed layer has a thickness in a range of about 0.2 μm to about 200 μm.

In some implementations of the example seed structure, the silicon carbide crystal growth process provides for growth of the crystalline silicon carbide structure on the growth surface of the seed layer at temperatures in a range of about 1500° C. to about 2500° C.

In an aspect, the present disclosure provides an example method for conducting crystal growth processes. The method includes providing a seed structure to a crystal growth system. The seed structure includes a carrier layer. The carrier layer is silicon carbide. The seed structure includes a seed layer with a bond to the carrier layer. The seed layer is crystalline silicon carbide. The method includes conducting a crystal growth process to grow a crystalline silicon carbide structure on a growth surface of the seed structure.

In some implementations of the example method, the carrier layer is polycrystalline silicon carbide and the seed layer is monocrystalline silicon carbide.

In some implementations of the example method, the carrier layer is monocrystalline silicon carbide and the seed layer is monocrystalline silicon carbide.

In some implementations of the example method, the bond is one or more covalent bonds.

In some implementations of the example method, the bond is a plasma-activated bond.

In some implementations of the example method, the bond is an electrostatic interaction at an interface between the carrier layer and the seed layer.

In some implementations of the example method, the electrostatic interaction is a van der Waals interaction.

In some implementations of the example method, the bond is a direct bond between the carrier layer and the seed layer without an intervening structure.

In some implementations of the example method, the bond provides an interface between one or more of the carrier layer, the seed layer, and one or more intervening structures.

In some implementations of the example method, the one or more intervening structures are a ceramic forming polymer or a silicon layer.

In some implementations of the example method, the one or more intervening structures are an oxide layer.

In some implementations of the example method, the oxide layer has a thickness of about 1 nm to about 5 nm.

In some implementations of the example method, the oxide layer has a thickness of about 5 nm to about 10 nm.

In some implementations of the example method, the one or more intervening structures has a thickness of about 1 nm to about 5 μm.

In some implementations of the example method, the one or more intervening structures has a thickness of about 200 nm to about 2 μm In some implementations of the example method, the carrier layer has a thickness that is greater than a thickness of the seed layer.

In some implementations of the example method, the carrier layer has a thickness that is at least five times greater than a thickness of the seed layer.

In some implementations of the example method, the carrier layer has a thickness in a range of about 1 μm to about 1000 μm.

In some implementations of the example method, the carrier layer has a thickness in a range of about 150 μm to about 500 μm.

In some implementations of the example method, the seed layer has a thickness in a range of about 0.2 μm to about 200 μm.

In some implementations of the example method, the silicon carbide crystal growth process is conducted at a temperature in a range of about 1500° C. to about 2500° C.

In some implementations of the example method, the method further includes providing a bulk seed structure of crystalline silicon carbide. The method may further include separating the seed layer from the bulk seed structure.

In some implementations of the example method, the method including separating the seed layer from the bulk seed structure further includes inducing a damage region beneath a surface of the bulk seed structure. The method may includes bonding the carrier layer to the surface of the bulk seed structure. The method may includes separating the seed layer from the bulk seed structure at least partially along the damage region such that the seed layer remains bonded to the carrier layer after separating the seed layer from the bulk seed structure.

In some implementations of the example method, the damage region is a laser-induced damage region.

In some implementations of the example method, the damage region is an implanted species induced damage region.

In some implementations of the example method, after separating the seed layer from the bulk seed structure, the method includes performing one or more surface processing operations on the seed layer bonded to the carrier layer.

In some implementations of the example method, the surface processing operation includes one or more of grinding, polishing, chemical mechanical polishing, lapping, or electrochemical mechanical polishing.

In an aspect, the present disclosure provides an example crystal growth system for growing crystalline material. The crystal growth system includes a crucible. The crystal growth system includes a seed holder. The crystal growth system includes a seed structure on the seed holder. The crystal growth system includes a source material within the crucible. The seed structure includes a carrier layer. The carrier layer is silicon carbide. The seed structure includes a seed layer bonded to the carrier layer with a bond. The seed layer is crystalline silicon carbide. The seed layer provides a growth surface for growing a crystalline silicon carbide structure in a silicon carbide crystal growth process.

In some implementations of the example crystal growth system, the carrier layer is polycrystalline silicon carbide and the seed layer is monocrystalline silicon carbide.

In some implementations of the example crystal growth system, the carrier layer is monocrystalline silicon carbide and the seed layer is monocrystalline silicon carbide.

In some implementations of the example crystal growth system, the bond includes one or more covalent bonds.

In some implementations of the example crystal growth system, the bond includes a plasma-activated bond.

In some implementations of the example crystal growth system, the bond includes an electrostatic interaction at an interface between the carrier layer and the seed layer.

In some implementations of the example crystal growth system, the electrostatic interaction is a van der Waals interaction.

In some implementations of the example crystal growth system, the bond is a direct bond between the carrier layer and the seed layer without an intervening structure.

In some implementations of the example crystal growth system, the bond provides an interface between one or more of the carrier layer, the seed layer, and one or more intervening structures.

In some implementations of the example crystal growth system, the one or more intervening structures are a ceramic forming polymer or a silicon layer.

In some implementations of the example crystal growth system, the one or more intervening structures are an oxide layer.

In some implementations of the example crystal growth system, the oxide layer has a thickness of about 1 nm to about 5 nm.

In some implementations of the example crystal growth system, the oxide layer has a thickness of about 5 nm to about 10 nm.

In some implementations of the example crystal growth system, the one or more intervening structures has a thickness of about 1 nm to about 5 μm.

In some implementations of the example crystal growth system, the one or more intervening structures has a thickness of about 200 nm to about 2 μm In some implementations of the example crystal growth system, the carrier layer has a thickness that is greater than a thickness of the seed layer.

In some implementations of the example crystal growth system, the carrier layer has a thickness that is at least five times greater than a thickness of the seed layer.

In some implementations of the example crystal growth system, the carrier layer has a thickness in a range of about 1 μm to about 1000 μm.

In some implementations of the example crystal growth system, the carrier layer has a thickness in a range of about 150 μm to about 500 μm.

In some implementations of the example crystal growth system, the seed layer has a thickness in a range of about 0.2 μm to about 200 μm.

In some implementations of the example crystal growth system, the silicon carbide crystal growth process provides for growth of the crystalline silicon carbide structure on the growth surface of the seed layer at temperatures in a range of about 1500° C. to about 2500° C.

While the present subject matter has been described in detail with respect to specific example embodiments thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A seed structure for a silicon carbide crystal growth system, wherein the seed structure comprises:

a carrier layer, the carrier layer comprising silicon carbide; and a seed layer bonded to the carrier layer with a bond, wherein the seed layer comprises crystalline silicon carbide, wherein the bond comprises an electrostatic interaction at an interface between the carrier layer and the seed layer;

wherein the seed layer provides a growth surface for growing a crystalline silicon carbide structure in a silicon carbide crystal growth process.

2. The seed structure of claim 1, wherein the carrier layer comprises polycrystalline silicon carbide and the seed layer comprises monocrystalline silicon carbide.

3. The seed structure of claim 1, wherein the carrier layer comprises monocrystalline silicon carbide and the seed layer comprises monocrystalline silicon carbide.

4. The seed structure of claim 1, wherein the bond comprises one or more covalent bonds.

5. The seed structure of claim 1, wherein the bond comprises a plasma-activated bond.

6. The seed structure of claim 1, wherein the bond is a direct bond between the carrier layer and the seed layer without an intervening structure.

7. A seed structure for a silicon carbide crystal growth system, wherein the seed structure comprises:

a carrier layer, the carrier layer comprising silicon carbide; and a seed layer bonded to the carrier layer with a bond wherein the seed layer comprises crystalline silicon carbide, wherein the bond provides an interface between one or more of the carrier layer, the seed layer, and one or more intervening structures, wherein the seed layer provides a growth surface for growing a crystalline silicon carbide structure in a silicon carbide crystal growth process.

8. The seed structure of claim 7, wherein the one or more intervening structures comprise a ceramic forming polymer or a silicon layer.

9. The seed structure of claim 8, wherein the one or more intervening structures comprises an oxide layer.

10. The seed structure of claim 9, wherein the oxide layer has a thickness of about 1 nm to about 5 nm.

11. The seed structure of claim 9, wherein the oxide layer has a thickness of about 5 nm to about 10 nm.

12. The seed structure of claim 7, wherein the one or more intervening structures has a thickness of about 1 nm to about 5 μm.

13. The seed structure of claim 7, wherein the one or more intervening structures has a thickness of about 200 nm to about 2 μm.

14. The seed structure of claim 1, wherein the carrier layer has a thickness that is greater than a thickness of the seed layer.

15. The seed structure of claim 1, wherein the carrier layer has a thickness that is at least five times greater than a thickness of the seed layer.

16. The seed structure of claim 1, wherein the carrier layer has a thickness in a range of about 1 μm to about 1000 μm.

17. The seed structure of claim 1, wherein the silicon carbide crystal growth process provides for growth of the crystalline silicon carbide structure on the growth surface of the seed layer at temperatures in a range of about 1500° C. to about 2500° C.

18. A method for conducting crystal growth processes, comprising:

providing a seed structure to a crystal growth system, the seed structure comprising a carrier layer, the carrier layer comprising silicon carbide, the seed structure comprising a seed layer with a bond to the carrier layer, wherein the seed layer comprises crystalline silicon carbide, wherein the bond provides an interface between one or more of the carrier layer, the seed layer and one or more intervening structures; and conducting a crystal growth process to grow a crystalline silicon carbide structure on a growth surface of the seed structure.

19. The method of claim 18, wherein the carrier layer comprises polycrystalline silicon carbide and the seed layer comprises monocrystalline silicon carbide.

20. The method of claim 18, wherein the carrier layer comprises monocrystalline silicon carbide and the seed layer comprises monocrystalline silicon carbide.

21. The method of claim 18, wherein the one or more intervening structures comprise a ceramic forming polymer or a silicon layer.

22. The method of claim 18, wherein the one or more intervening structures comprise an oxide layer.

23. The method of claim 18, wherein the one or more intervening structures has a thickness of about 1 nm to about 5 μm.

24. The method of claim 18, wherein the carrier layer has a thickness that is greater than a thickness of the seed layer.

25. The method of claim 18, wherein the carrier layer has a thickness that is at least five times greater than a thickness of the seed layer.

26. The method of claim 18, wherein the carrier layer has a thickness in a range of about 150 μm to about 500 μm.

27. The method of claim 18, wherein the seed layer has a thickness in a range of about 0.2 μm to about 200 μm.

28. The method of claim 18, wherein the silicon carbide crystal growth process is conducted at a temperature in a range of about 1500° C. to about 2500° C.

29. The method of claim 18, wherein the method further comprises:

providing a bulk seed structure of crystalline silicon carbide;

separating the seed layer from the bulk seed structure.

30. The method of claim 29, wherein the method comprising separating the seed layer from the bulk seed structure comprises:

inducing a damage region beneath a surface of the bulk seed structure;

bonding the carrier layer to the surface of the bulk seed structure; and separating the seed layer from the bulk seed structure at least partially along the damage region such that the seed layer remains bonded to the carrier layer after separating the seed layer from the bulk seed structure.

* * * * *